(12) United States Patent
Nomoto et al.

(10) Patent No.: US 9,041,186 B2
(45) Date of Patent: May 26, 2015

(54) ENCAPSULATED SEMICONDUCTOR CHIPS WITH WIRING INCLUDING CONTROLLING CHIP AND METHOD OF MAKING THE SAME

(71) Applicant: FUJITSU SEMICONDUCTOR LIMITED, Yokohama-shi, Kanagawa (JP)

(72) Inventors: Ryuji Nomoto, Kawasaki (JP); Yoshiyuki Yoneda, Kawasaki (JP); Koichi Nakamura, Fuchu (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 13/849,248

(22) Filed: Mar. 22, 2013

(65) Prior Publication Data

US 2013/0299845 A1 Nov. 14, 2013

(30) Foreign Application Priority Data

May 11, 2012 (JP) .................................. 2012-110099

(51) Int. Cl.
*H01L 23/48* (2006.01)
*H01L 23/02* (2006.01)
(Continued)

(52) U.S. Cl.
CPC ............ *H01L 23/02* (2013.01); *H01L 29/2003* (2013.01); *H01L 21/56* (2013.01); *H01L 23/3128* (2013.01); *H01L 21/561* (2013.01); *H01L 21/568* (2013.01); *H01L 24/97* (2013.01); *H01L 2224/32145* (2013.01);
(Continued)

(58) Field of Classification Search
CPC ....... H01L 21/56; H01L 21/58; H01L 21/563; H01L 23/31; H01L 23/28; H01L 23/485; H01L 23/495; H01L 23/498; H01L 23/4952; H01L 23/52

USPC .................................. 257/186; 438/109–127
See application file for complete search history.

(56) References Cited

U.S. PATENT DOCUMENTS 6,150,724 A * 11/2000 Wenzel et al. ................ 257/777
6,414,385 B1 * 7/2002 Huang et al. .................. 257/690
(Continued)

FOREIGN PATENT DOCUMENTS

JP 2005-327805 A 11/2005
JP 2007-234683 A 9/2007
(Continued)

*Primary Examiner* — Evan Pert
*Assistant Examiner* — Herve Assouman
(74) *Attorney, Agent, or Firm* — Westerman, Hattori, Daniels & Adrian, LLP

(57) ABSTRACT

Disclosed is a semiconductor device including first and second semiconductor elements, first and second external connection terminals and a sealing member. The first external connection terminal is provided at a first surface of the first semiconductor element. The second semiconductor element is provided at a second surface side, that is at a side opposite to the first surface, of the first semiconductor element. The second external connection terminal is connected to the second semiconductor element, and the second external connection terminal is configured to be, together with the first external connection terminal, connected to a wiring board. The sealing member seals the first and second semiconductor elements and exposes a portion, that is configured to be connected to the wiring board, of the first external connection terminal and a portion, that is configured to be connected to the wiring board, of the second external connection terminal.

19 Claims, 22 Drawing Sheets

(51) Int. Cl.
*H01L 29/20* (2006.01)
*H01L 21/56* (2006.01)
*H01L 23/00* (2006.01)
*H01L 23/495* (2006.01)
*H01L 25/16* (2006.01)
*H01L 25/00* (2006.01)
H01L 23/31 (2006.01)
H01L 23/13 (2006.01)
H01L 23/498 (2006.01)

(52) U.S. Cl.
CPC ............... H01L 2224/32245 (2013.01); *H01L 2224/48227* (2013.01); *H01L 2224/48247* (2013.01); *H01L 2224/73253* (2013.01); *H01L 2224/73265* (2013.01); *H01L 2224/97* (2013.01); *H01L 2924/15151* (2013.01); *H01L 2924/15311* (2013.01); *H01L 2924/10253* (2013.01); H01L 23/3107 (2013.01); H01L 23/49551 (2013.01); H01L 23/49562 (2013.01); H01L 23/49575 (2013.01); H01L 2224/48091 (2013.01); H01L 2224/45144 (2013.01); H01L 2924/13064 (2013.01); H01L 23/13 (2013.01); H01L 25/16 (2013.01); H01L 25/50 (2013.01); H01L 2924/30107 (2013.01); H01L 23/49816 (2013.01); H01L 2924/1306 (2013.01)

(56) References Cited

U.S. PATENT DOCUMENTS

| | | | |
|---|---|---|---|
| 6,762,079 B2* | 7/2004 | Vaiyapuri | 438/123 |
| 6,979,593 B2* | 12/2005 | Kawakami | 438/110 |
| 7,569,920 B2* | 8/2009 | Otremba et al. | 257/686 |
| 7,619,303 B2* | 11/2009 | Bayan | 257/666 |
| 7,679,173 B2* | 3/2010 | Uno et al. | 257/678 |
| 7,851,909 B2* | 12/2010 | Mishra et al. | 257/728 |
| 8,212,361 B2* | 7/2012 | Joshi et al. | 257/773 |
| 2005/0161785 A1* | 7/2005 | Kawashima et al. | 257/678 |
| 2005/0194674 A1* | 9/2005 | Thomas et al. | 257/690 |
| 2005/0258452 A1 | 11/2005 | Konishi et al. | |
| 2007/0215996 A1* | 9/2007 | Otremba | 257/678 |
| 2008/0073779 A1* | 3/2008 | Song | 257/723 |
| 2008/0169537 A1* | 7/2008 | Kajiwara et al. | 257/666 |
| 2008/0237846 A1* | 10/2008 | Terui et al. | 257/717 |
| 2009/0194792 A1 | 8/2009 | Konishi et al. | |
| 2010/0148328 A1* | 6/2010 | Son et al. | 257/675 |
| 2010/0203682 A1* | 8/2010 | Kikuchi et al. | 438/123 |
| 2011/0089563 A1* | 4/2011 | Kikuchi et al. | 257/738 |
| 2011/0198611 A1* | 8/2011 | Cheah et al. | 257/76 |
| 2012/0280308 A1* | 11/2012 | Disney | 257/329 |

FOREIGN PATENT DOCUMENTS

| | | |
|---|---|---|
| JP | 2008-091418 A | 4/2008 |
| JP | 2009-176839 A | 8/2009 |
| JP | 2009-212250 A | 9/2009 |

* cited by examiner

ENCAPSULATED SEMICONDUCTOR CHIPS WITH WIRING INCLUDING CONTROLLING CHIP AND METHOD OF MAKING THE SAME

CROSS-REFERENCE TO RELATED APPLICATION

This application is based upon and claims the benefit of priority of the prior Japanese Patent Application No. 2012-110099, filed on May 11, 2012, the entire contents of which are incorporated herein by reference.

FIELD

The embodiments discussed herein are related to a semiconductor device, a semiconductor device module, and a method of fabricating a semiconductor device.

BACKGROUND

Layering and mounting another semiconductor element on a high-output semiconductor element or a high-frequency semiconductor element that is mounted on a wiring board, is proposed. The high-output semiconductor element or the high-frequency semiconductor element is connected, via a through via of the wiring board, to an external connection terminal that is provided at the bottom surface of the wiring board.

Providing a member for heat dissipation that contacts a top surface of a high-output semiconductor element, and providing, at a bottom surface, a dummy bump for heat dissipation that is the same size as a bump for signals, is proposed to carry out heat dissipation from both the top and bottom surfaces of the high-output semiconductor element.

Exposing a terminal of a bottom surface of a chip, that is disposed within an opening of a wiring board and is sealed by an insulating layer, at the bottom surface of a package via a wire within that insulating layer, is proposed.

A package is proposed wherein first and second chips are disposed within a sealing resin, and an electrode at the bottom surface of the lower side chip is connected, via a lead that is embedded in the resin, to a terminal that is exposed at the bottom surface of the package.

RELATED PATENT DOCUMENTS

Japanese Laid-Open Patent Publication No. 2005-327805
Japanese Laid-Open Patent Publication No. 2007-234638
Japanese Laid-Open Patent Publication No. 2009-176839
Japanese Laid-Open Patent Publication No. 2009-212250
Japanese Laid-Open Patent Publication No. 2008-91418

SUMMARY

According to an aspect of the embodiments, a semiconductor device includes:
a first semiconductor element at which a first external connection terminal is provided at a first surface;
a second semiconductor element provided at a second surface side, that is at a side opposite to the first surface, of the first semiconductor element;
a second external connection terminal that is connected to the second semiconductor element, and is configured to be, together with the first external connection terminal, connected to a wiring board; and
a sealing member that seals the first semiconductor element and the second semiconductor element, and that exposes a portion, that is configured to be connected to the wiring board, of the first external connection terminal and a portion, that is configured to be connected to the wiring board, of the second external connection terminal.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

As described above, there have been proposed semiconductor devices in which another semiconductor element is mounted so as to be layered on a high-output semiconductor element or a high-frequency semiconductor element that is mounted on a wiring board. In these semiconductor devices, the high-output semiconductor element or the high-frequency semiconductor element is connected, via a through via of the wiring board, to an external connection terminal that is provided at the bottom surface of the wiring board.

As a result of diligently studying semiconductor devices of this structure, the present inventors have found that there are the following problematic points. The high-output semiconductor element or the high-frequency semiconductor element is connected to an external connection terminal via a through via. Because it is difficult to make the resistance value of the through via sufficiently low, it is difficult to cause a large current to flow. Further, because it is difficult to make the inductance of the through via sufficiently low, high-speed operation is difficult. On the basis of such knowledge, the present inventors propose the techniques disclosed in the present application.

Preferred embodiments of the techniques disclosed in the present application are described next with reference to the drawings.

Figure 1A:
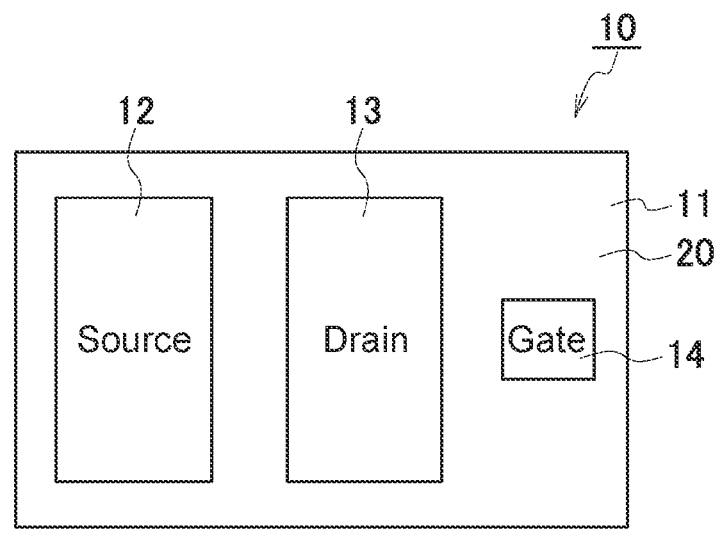
FIG. 1A is a schematic plan view for explaining a GaN chip that is preferably used in semiconductor devices and semiconductor device modules of first through third embodiments.

Referring to FIG. 1A, a GaN chip 10, that is preferably used in semiconductor devices of the first through third embodiments, has a gallium nitride (GaN) substrate 11, and a source electrode 12, drain electrode 13 and gate electrode 14 that are formed on an obverse 20 of the GaN substrate 11. Note that the surface areas of the source electrode 12 and the drain electrode 13 are larger than the surface area of the gate electrode 14. An AlGaN layer (not illustrated) is provided on a surface of the GaN substrate 11. The AlGaN layer forms a heterojunction with the GaN substrate. The GaN chip 10 is a semiconductor element that utilizes the two-dimensional electron gas generated at the heterojunction interface between the AlGaN and GaN, and has a HEMT (High Electron Mobility Transistor) type structure. The GaN chip 10 functions as a high-frequency semiconductor element due to the high mobility of the two-dimensional electron gas. Further, because GaN has a large band gap and high breakdown voltage strength, the GaN chip 10 is used as a high-output semiconductor element. Accordingly, the GaN chip 10 is used as a gallium nitride type high-frequency high-output semiconductor element having a heterojunction between the AlGaN and GaN. A gate (not illustrated) is provided between the source electrode 12 and the drain electrode 13. The gate (not illustrated) is connected to the gate electrode 14 via a gate wire (not illustrated) that is on the GaN substrate 11. The gate electrode 14 functions as a control electrode that controls the current that flows between the source electrode 12 and the drain electrode 13.

Figure 2:
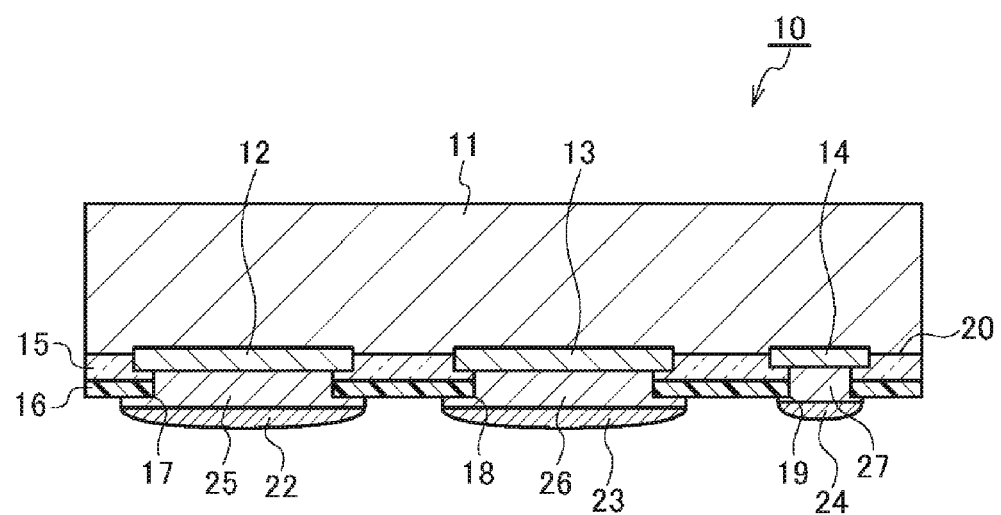
FIG. 2 is a schematic longitudinal sectional view for explaining an example of the GaN chip that is preferably used in the semiconductor devices and semiconductor device modules of the first through fourth embodiments.

Referring to FIG. 2, solder bumps 22, 23, 24 are provided at the GaN chip 10. An SiO$_2$ film 15 is provided so as to cover the source electrode 12, the drain electrode 13 and the gate electrode 14 that are formed on the obverse 20 of the GaN substrate 11. An organic protective film 16 is provided on the SiO$_2$ film 15. For example, a polyimide resin or an epoxy resin is preferably used as the organic protective film 16. Through-holes 17, 18, 19, that expose the source electrode 12, the drain electrode 13 and the gate electrode 14 respectively, are formed in the SiO$_2$ film 15 and the organic protecting film 16. Cu electrodes 25, 26, 27 are formed in the through-holes 17, 18, 19, respectively. The solder bumps 22, 23, 24 are connected, via the Cu electrodes 25, 26, 27 respectively, to the source electrode 12, the drain electrode 13 and the gate electrode 14 respectively. The solder bumps 22, 23, 24 are examples of projecting electrodes, and are an example of an external connection terminal. The solder bumps 22, 23 are examples of external connection sub-terminals, and the solder bump 24 is an example of an external connection control terminal. The GaN chip 10 is surface mounted by the solder bumps 22, 23, 24.

Figure 3:
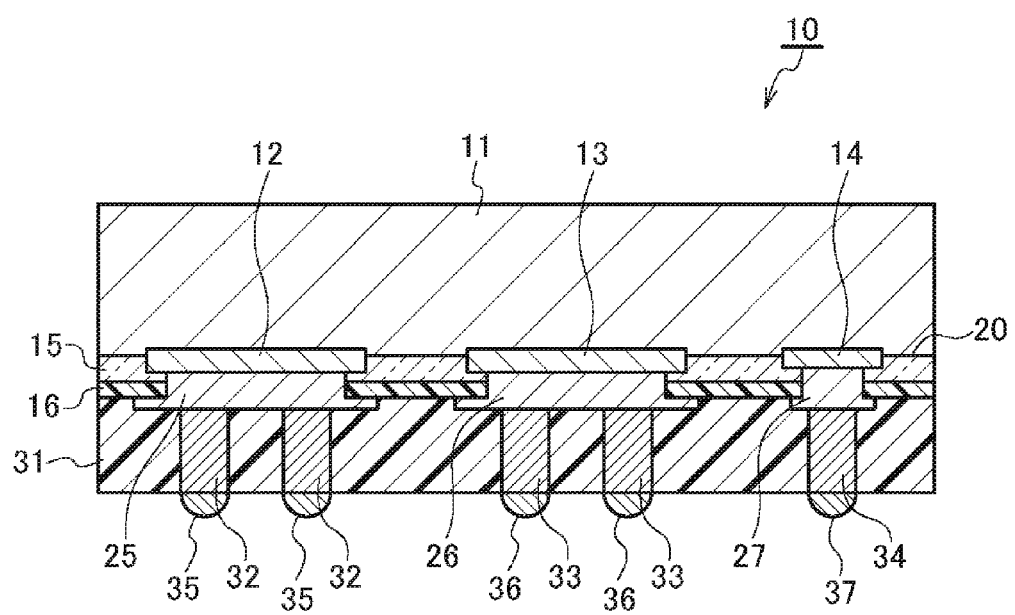
FIG. 3 is a schematic longitudinal sectional view for explaining another example of the GaN chip that is preferably used in the semiconductor devices and semiconductor device modules of the first through fourth embodiments.

Referring to FIG. 3, the GaN chip 10 that is of another surface mounted form is described. Solder balls 35, 36, 37 are provided at the GaN chip 10. The SiO$_2$ film 15 and the organic protective film 16 are provided so as to cover the source electrode 12, the drain electrode 13 and the gate electrode 14 that are formed on the obverse 20 of the GaN substrate 11. For example, a polyimide resin is preferably used as the organic protective film 16. The through-holes 17, 18, 19, that expose the source electrode 12, the drain electrode 13 and the gate electrode 14 respectively, are formed in the SiO$_2$ film 15 and the organic protecting film 16. The Cu electrodes 25, 26, 27 are formed in the through-holes 17, 18, 19, respectively. Cu posts 32, 33, 34 are formed on the Cu electrodes 25, 26, 27, respectively. A resin sealing layer 31 is provided so as to cover the Cu posts 32, 33, 34, the Cu electrodes 25, 26, 27, and the organic protective film 16. For example, an epoxy resin is preferably used as the resin sealing layer 31. The solder balls 35, 36, 37 are formed on the Cu posts 32, 33, 34, respectively. The solder balls 35 are connected to the source electrode 12 via the Cu electrode 25 and the Cu posts 32. The solder balls 36 are connected to the drain electrode 13 via the Cu electrode 26 and the Cu posts 33. The solder ball 37 is connected to the gate electrode 14 via the Cu electrode 27 and the Cu post 34. The solder balls 35, 36, 37 are examples of projecting electrodes, and are an example of an external connection terminal. The solder balls 35, 36 are examples of external connection sub-terminals, and the solder ball 37 is an example of an external connection control terminal. The GaN chip 10 is surface mounted by the solder balls 35, 36, 37.

Figure 1B:
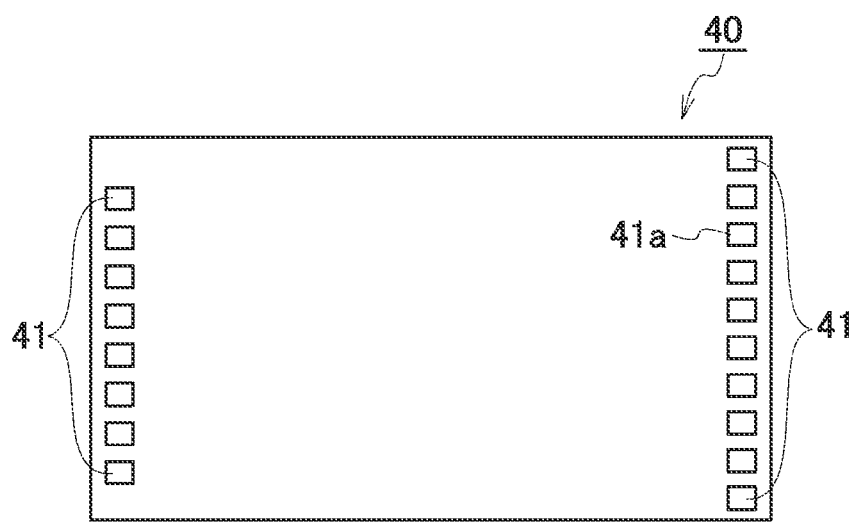
FIG. 1B is a schematic plan view for explaining a control chip that is preferably used in semiconductor devices and semiconductor device modules of first through fourth embodiments.

Referring to FIG. 1B, plural terminals 41 are provided at the periphery of a control chip (logic chip) 40 that is preferably used in the semiconductor devices and semiconductor device modules of the first through fourth embodiments. The control chip 40 is an example of a semiconductor element for control that controls operation of the GaN chip 10. The control chip 40 incorporates therein a gate driver for controlling operation of the GaN chip 10. One terminal 41a among the plural terminals 41 is connected to the gate electrode 14 of the GaN chip 10.

First Embodiment

Figure 4:
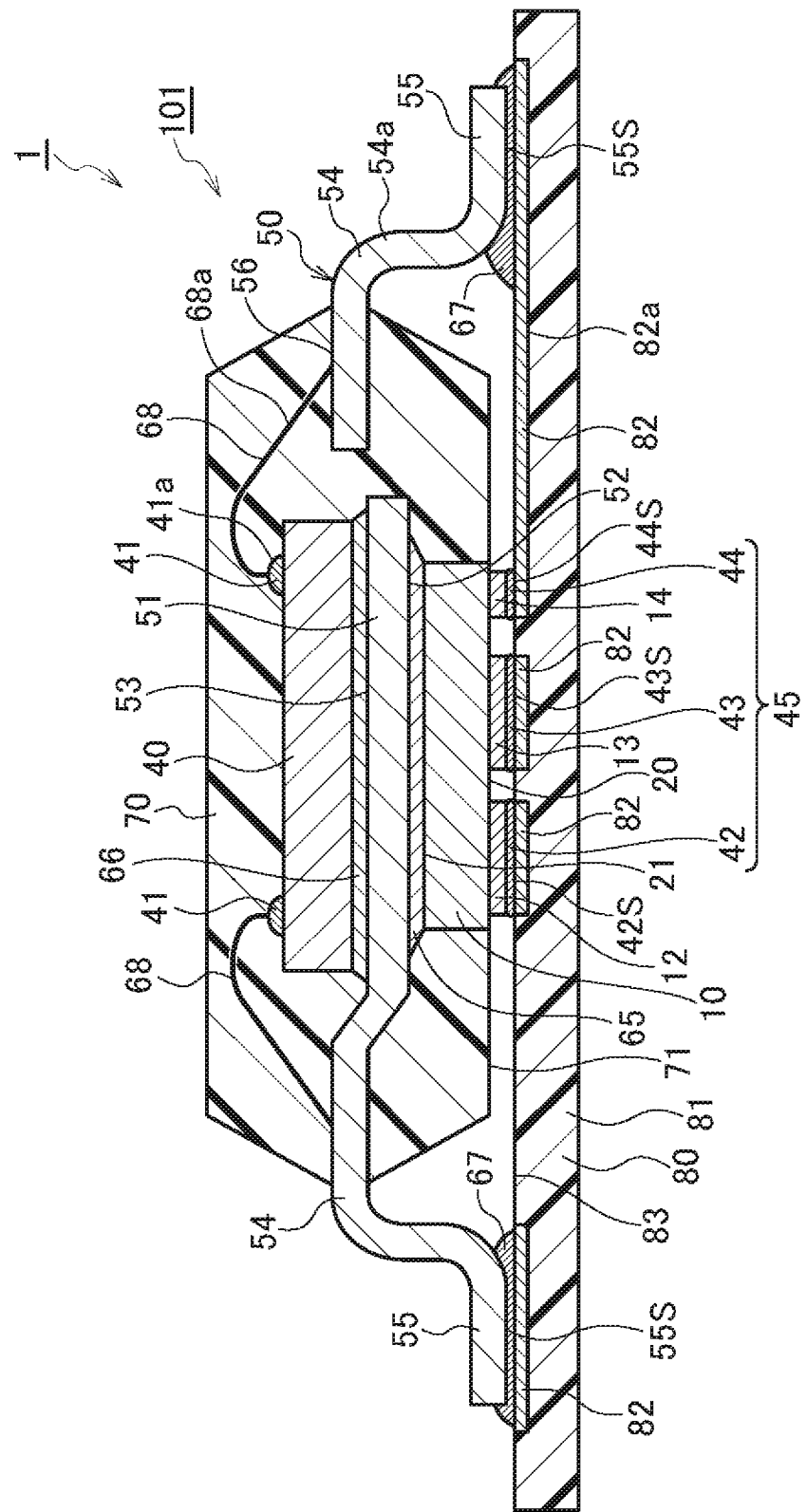
FIG. 4 is a schematic longitudinal sectional view for explaining the semiconductor device and the semiconductor device module of the first embodiment.

A semiconductor device 1 and a semiconductor device module 101 of a first embodiment are described next with reference to FIG. 4. The semiconductor device 1 has the GaN chip 10, the control chip 40, a lead frame 50, and sealing resin 70. The GaN chip 10 and the control chip 40 are made into a single package. The semiconductor device module 101 has the semiconductor device 1 and a motherboard 80. The motherboard 80 is an example of a wiring board.

Figure 12:
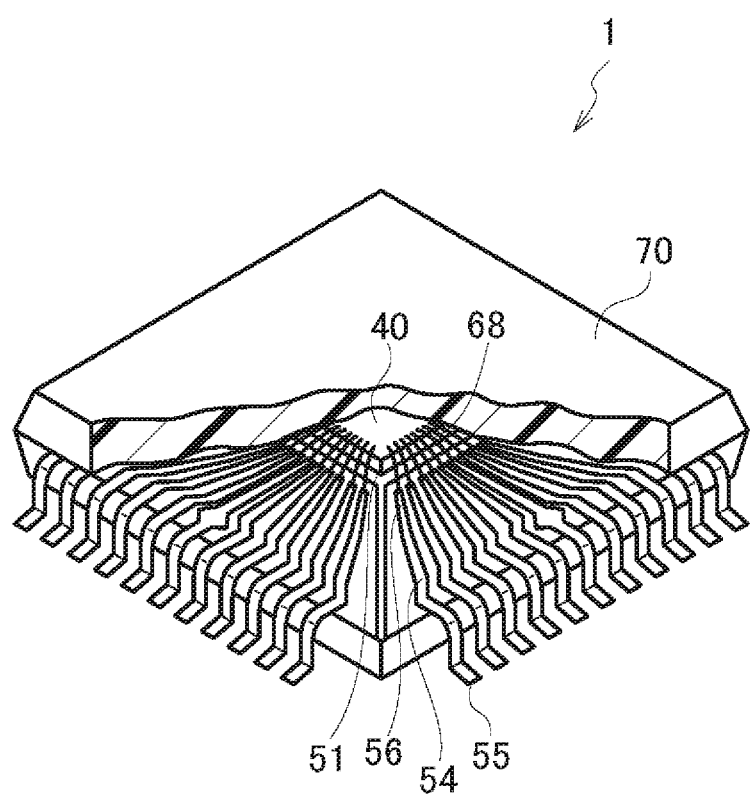
FIG. 12 is a partially cut-out schematic perspective view for explaining a QFP type package.

The semiconductor device 1 of the present embodiment is formed as a QFP (Quad Flat Package) type package such as illustrated in FIG. 12. The chip 40 is mounted on a die stage 51, and terminals of the chip 40 are connected by bonding wires 68 to inner side portions 56 of lead terminals 54. The lead terminals 54 are bent midway therealong, and outer side portions 55 of the lead terminals 54 are parallel to the surface of the wiring board on which the QFP is mounted. The lead terminals 54 are provided at the four sides of the package. The chip 40, the die stage 51, and the inner side portions 56 of the lead terminals 54 are sealed by the sealing resign 70 such as a molding resin or the like. The outer side portions 55 of the lead terminals 54 are connected to wires of the wiring board.

Referring to FIG. 4 again, the GaN chip 10 has an external connection terminal 45 on the obverse 20 thereof. The external connection terminal 45 has external connection sub-terminals 42, 43 and an external connection control terminal 44. The external connection sub-terminal 42 is connected to the source electrode 12 (refer to FIGS. 1A, 1B, 2, 3). The external connection sub-terminal 43 is connected to the drain electrode 13 (refer to FIGS. 1A, 1B, 2, 3). The external connection control terminal 44 is connected to the gate electrode 14 (refer to FIGS. 1A, 1B, 2, 3). The external connection sub-terminals 42, 43 and the external connection control terminal 44 are preferably formed by, for example, the solder bumps 22, 23, 24 (refer to FIG. 2) or the solder balls 35, 36, 37 (refer to FIG. 3). The solder bumps 22, 23, 24 and the solder balls 35, 36, 37 may be formed by Cu/Ni or the like instead of solder.

The lead frame 50 has the die stage 51 and the plural lead terminals 54. The GaN chip 10 is mounted on a bottom surface 52 of the die stage 51 by a die bonding material 65. The die bonding material 65 is electrically conductive. A reverse surface 21 of the GaN chip 10 faces the bottom surface 52 of the die stage 51, and the obverse 20 and the external connection terminal 45 of the GaN chip 10 face the side opposite to the die stage 51. In this way, the GaN chip 10 is mounted face-down on the bottom surface 52 of the die stage 51.

The control chip 40 is mounted on a top surface 53 of the die stage 51 by a die bonding material 66. The die bonding material 66 is electrically conductive. The terminals 41 of the control chip 40 are connected by the bonding wires 68 to the inner side portions 56 of the lead terminals 54. For example, metal wires are preferably used as the bonding wires 68.

The GaN chip 10, the control chip 40 and the die stage 51 are sealed by the sealing resin 70. The bonding wires 68 also are sealed by the sealing resin 70. The inner side portions 56 of the lead terminals 54 are sealed by the sealing resin 70. The outer side portions 55 of the lead terminals 54 are exposed from the sealing resin 70. The external connection terminal 45 of the GaN chip 10 is exposed from a reverse surface 71 of the sealing resin 70.

The lead terminals 54 are bent midway therealong, and bottom surfaces 55s of the outer side portions 55 of the lead terminals 54 are substantially the same heights as bottom surfaces 42s, 43s, 44s of the external connection sub-terminals 42, 43 and the external connection control terminal 44 of the GaN chip 10.

The motherboard 80 has a substrate 81 and wires 82 that are formed on a top surface 83 of the substrate 81. The outer side portions 55 of the lead terminals 54 are connected to the wires 82 via solder 67. The control chip 40 is connected to the motherboard 80 via the lead terminals 54, and is mounted to the motherboard 80. The external connection terminal 45 (the external connection sub-terminals 42, 43 and the external connection control terminal 44) of the GaN chip 10 is connected to the wires 82. Via the external connection terminal 45, the GaN chip 10 is directly connected to the motherboard 80, and is mounted to the motherboard 80.

The gate electrode 14 (refer to FIGS. 1A, 1B, 2, 3) is connected to the terminal 41a for gate connection of the control chip 40, via the external connection control terminal 44, a wire 82a of the motherboard 80, a lead terminal 54a, and a bonding wire 68a.

The die stage 51 is directly connected to one lead terminal 54b or plural lead terminals 54b among the plural lead terminals 54.

In the present embodiment, the GaN chip 10 and the control chip 40 are layered vertically and made into a single package, and therefore, the mounting surface area can be made to be small.

Further, because the GaN chip 10 and the control chip 40 are made into a single package, the assembly processes are simplified.

The bottom surfaces 55s of the lead terminals 55 are substantially the same heights as the bottom surfaces 42s, 43s, 44s of the external connection sub-terminals 42, 43 and the external connection control terminal 44 of the GaN chip 10. Therefore, the lead terminals 54 and the external connection terminal 45 of the GaN chip 10 are both connected to the motherboard 80.

The external connection terminal 45 (the external connection sub-terminals 42, 43 and the external connection control terminal 44) are exposed from the reverse surface 71 of the sealing resin 70. Further, the GaN chip 10 is directly connected to the motherboard 80 via the external connection terminal 45. Therefore, a large current can be made to flow. Further, without providing a heat dissipating plate, the heat of the GaN chip 10 can be dissipated effectively from the external connection terminal 45 directly to the motherboard 80. Moreover, by making the surface areas, i.e., the heat dissipation surface areas, of the external connection sub-terminals 42, 43 large, the heat of the GaN chip 10 can be effectively dissipated. As a result, the semiconductor device 1 of the present embodiment is preferably applied to high-output semiconductor elements such as the GaN chip 10 or the like. Further, because the inductance of the external connection terminal 45 can be made to be sufficiently low, high-speed operation is possible. Accordingly, the semiconductor device 1 of the present embodiment is suitably applied to high-frequency semiconductor elements such as the GaN chip 10 or the like.

In particular, the external connection sub-terminal 42, that is connected to the source electrode 12 (refer to FIGS. 1A, 1B, 2, 3), and the external connection sub-terminal 43, that is connected to the drain electrode 13 (refer to FIGS. 1A, 1B, 2, 3) are directly connected to the motherboard 80. Accordingly, the wiring inductance of the source and the drain can be greatly reduced, and current does not go through superfluous wires, leads or substrate wires. Therefore, high-speed switching is possible, and a large current can easily be made to flow.

The external connection control terminal 44, that is connected to the gate electrode 14 (refer to FIGS. 1A, 1B, 2, 3), also is connected directly to the motherboard 80. Further, the external connection control terminal 44 is connected to the terminal 41a for gate connection of the control chip 40 via the wire 82a of the motherboard 80, the lead terminal 54a and the bonding wire 68a. In this way, the gate of the GaN chip 10 and the control chip 40 that controls this gate can be connected via the motherboard 80, and therefore, the structure is simple.

Because the lead frame 50 is used in order to make the GaN chip 10 and the control chip 40 into a single package, the semiconductor device 1 can be fabricated inexpensively.

The reverse surface 21 of the GaN chip 10 is connected to the die stage 51 by the die bonding material 65 that is electrically conductive. Further, the die stage 51 is directly connected to the one lead terminal 54b or the plural lead terminals 54b among the plural lead terminals 54. Accordingly, the potential of the reverse surface 21 of the GaN chip 10 can easily be ensured. Further, the heat at the reverse surface 21 side of the GaN chip 10 also can easily escape via the lead terminal(s) 54b.

An example of a method of fabricating the semiconductor device 1 of the first embodiment is described next with reference to FIG. 7 and FIGS. 8A to 8D, 9A and 9B.

Figure 7:
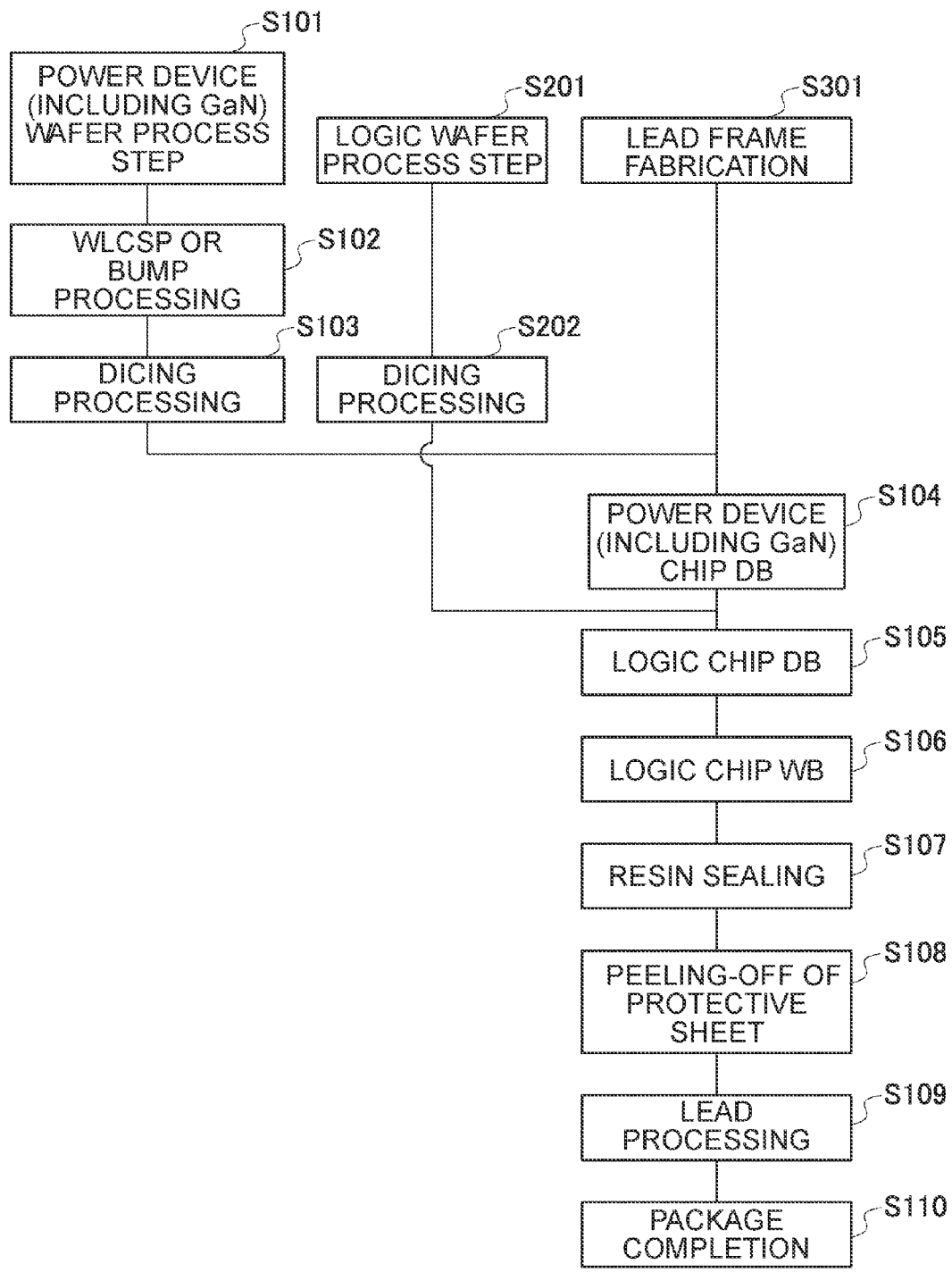
FIG. 7 is a flowchart for explaining a method of fabricating the semiconductor devices of the first through third embodiments.

First, plural GaN type high-frequency high-output semiconductor elements, that serve as examples of power devices and that have an AlGaN layer that forms a heterojunction with GaN and that have a source electrode, a drain electrode and a gate electrode, are formed on a GaN wafer (refer to FIG. 7, step S101).

Next, solder bumps or solder balls, that are respectively connected to the source electrodes, the drain electrodes and the gate electrodes, are formed, and external connection terminals for surface mounting are formed (refer to FIG. 7, step S102). Note that wafer level packaging (WLCSP: Wafer Level Chip Size Packaging) may be carried out instead of forming the solder bumps or solder balls.

Next, dicing processing is carried out, and the GaN wafer is cut (refer to FIG. 7, step S103) into the plural GaN chips 10 (refer to FIGS. 2, 3).

Separately from these processes, plural semiconductor elements for control (logic) are formed at a silicon wafer (refer to FIG. 7, step S201).

Next, dicing processing is carried out, and the silicon wafer is cut (refer to FIG. 7, step S202) into the plural control chips 40 (refer to FIG. 1B).

Separately from these processes, a lead frame is fabricated (refer to FIG. 7, step S301).

Figure 8A:
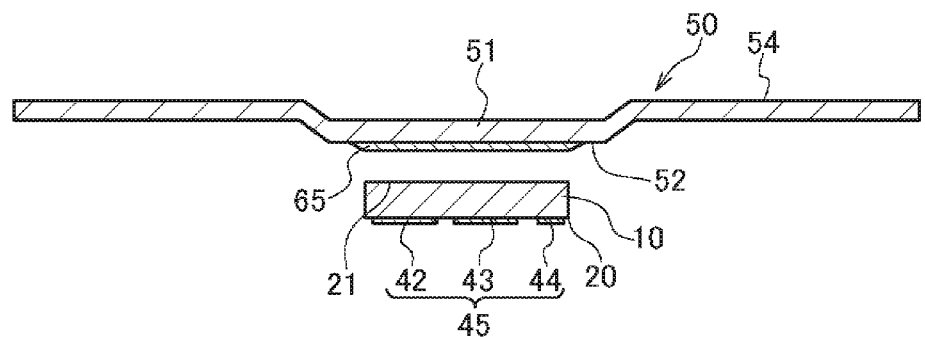
FIGS. 8A to 8D are schematic longitudinal sectional views for explaining the method of fabricating the semiconductor device of the first embodiment.

Next, the GaN chip 10 that serves as an example of a power device is mounted face-down on the bottom surface 52 of the die stage 51 of the lead frame 50 by the die bonding material 65 (refer to step S104 of FIG. 7, and FIG. 8A). The reverse surface 21 of the GaN chip 10 faces the bottom surface 52 of the die stage 51, and the obverse 20 and the external connection terminal 45 of the GaN chip 10 face toward the side opposite to the die stage 51.

Figure 8B:
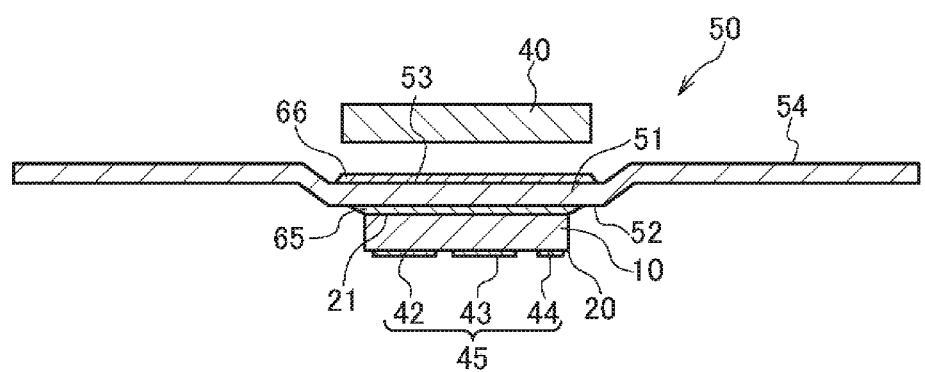

Next, the control chip 40 is mounted face-up on the top surface 53 of the die stage 51 by the die bonding material 66 (refer to step S105 of FIG. 7, and FIG. 8B).

Figure 8C:
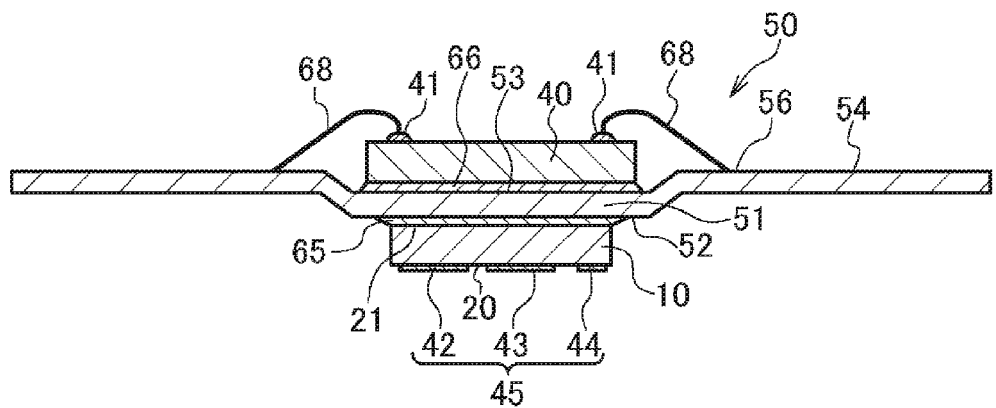

Next, the terminals 41 of the control chip 40 are connected by the bonding wires 68 to the inner side portions 56 of the lead terminals 54 (refer to step S106 of FIG. 7, and FIG. 8C). Note that the GaN chip 10 is not wire bonded.

Figure 8D:
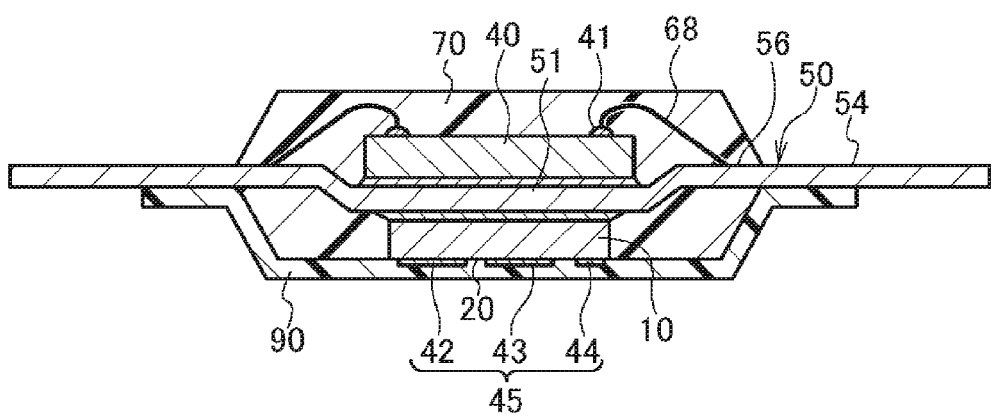

Next, a pressure-resistant protective sheet 90 is set in the lower mold of a sealing mold (not illustrated), and mold sealing is carried out together with the protective sheet 90 (refer to step S107 of FIG. 7, and FIG. 8D). At this time, the external connection terminal 45 and the obverse 20 of the GaN chip 10 are covered by the protective sheet 90. The GaN chip 10, the control chip 40, the die stage 51, the bonding wires 68, and the inner side portions 56 of the lead terminals 54 are sealed by the sealing resin 70. For example, PTFE is suitably used as the protective sheet 90. The protective sheet 90 is used in order to prevent the sealing resin 70 from finding its way around to the obverse 20 and the external connection terminal 45 of the GaN chip 10, and to protect the obverse 20 and the external connection terminal 45 of the GaN chip 10.

Figure 9A:
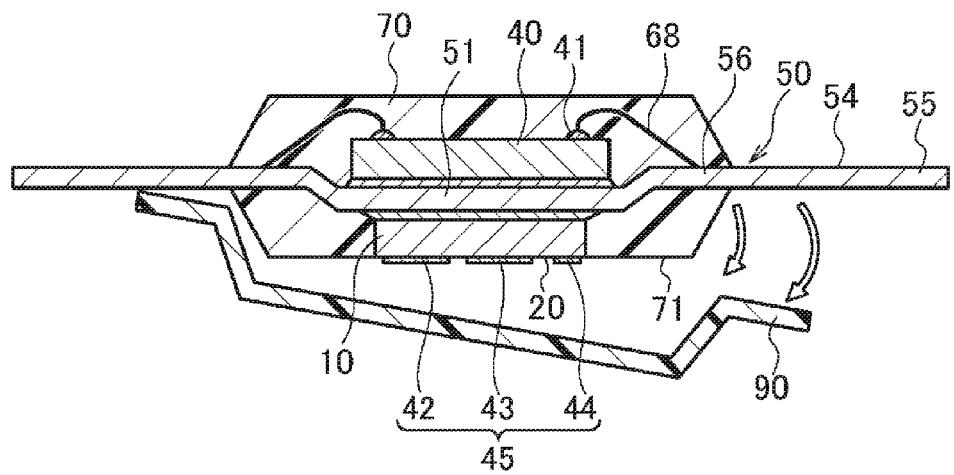
FIGS. 9A and 9B are schematic longitudinal sectional views for explaining the method of fabricating the semiconductor device of the first embodiment.

After completion of the mold sealing, the protective sheet 90 is peeled-off, and the obverse 20 of the GaN chip 10 is exposed at the package bottom surface (refer to step S108 of FIG. 7, and FIG. 9A). At this time, the external connection terminal 45 of the GaN chip 10 is exposed. By using the protective sheet 90 in this way, the external connection terminal 45 of the GaN chip 10 can be exposed easily merely by adding the step of providing the protective sheet 90 and the step of peeling-off the protective sheet 90.

Figure 9B:
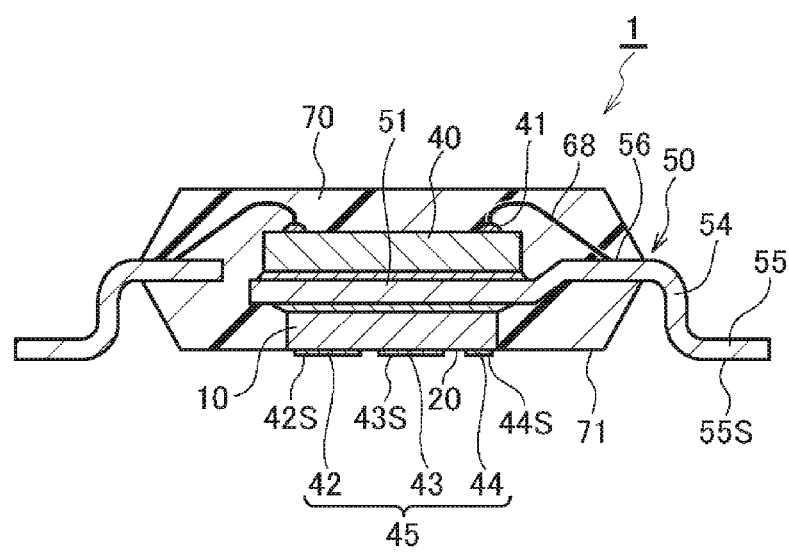

Next, portions midway along the lead terminals 54 are subjected to bending processing (refer to step S109 of FIG. 7, and FIG. 9B). Due to this process, the bottom surfaces 55s of the outer side portions 55 of the lead terminals 54 are made to be substantially the same heights as the bottom surfaces of the external connection terminal 45 of the GaN chip 10 (the bottom surfaces 42s, 43s, 44s of the external connection sub-terminals 42, 43 and the external connection control terminal 44).

Due to the above, the package is completed, and the semiconductor device 1 is fabricated (refer to step S110 of FIG. 7).

Second Embodiment

Figure 5:
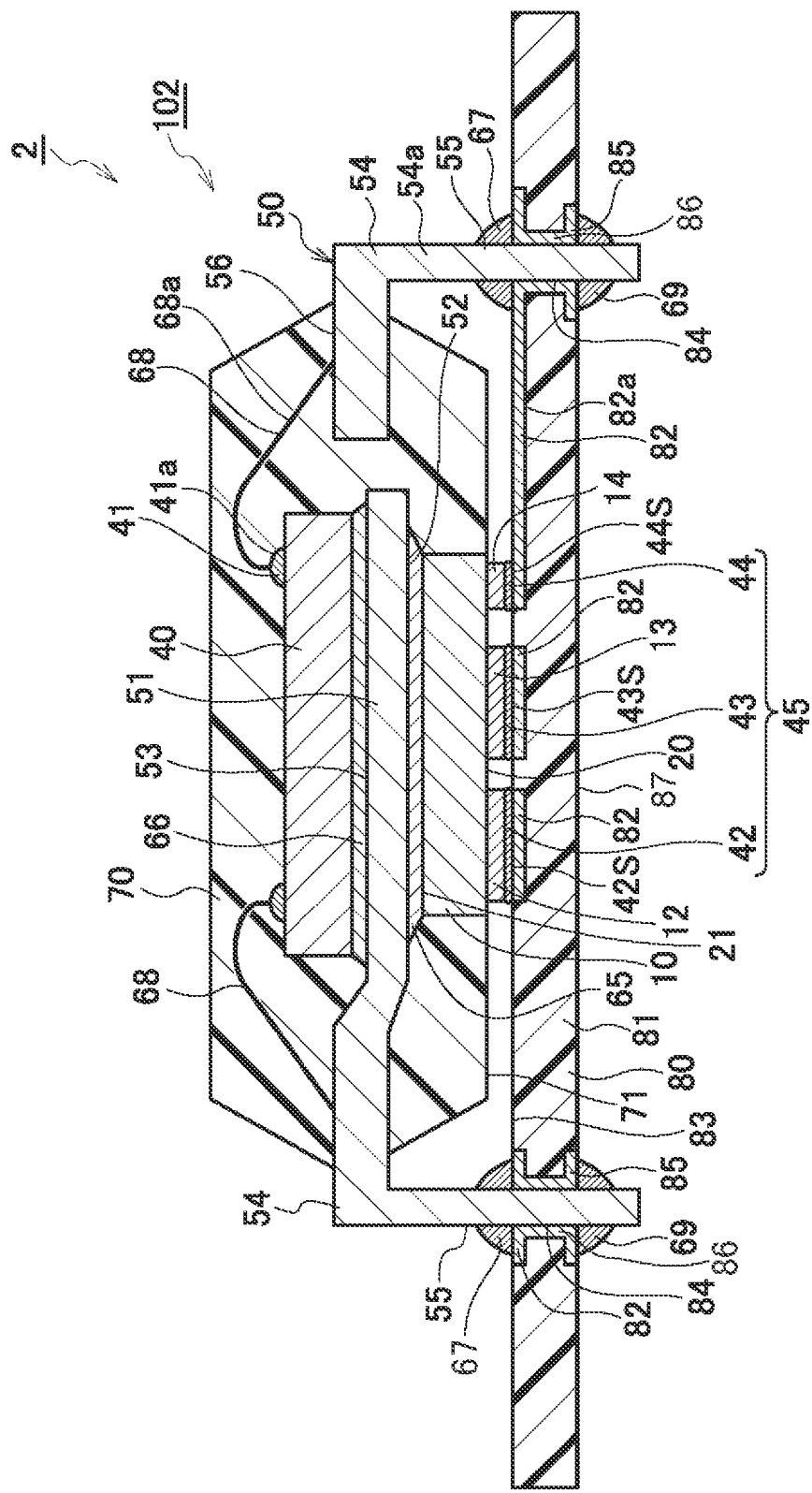
FIG. 5 is a schematic longitudinal sectional view for explaining the semiconductor device and the semiconductor device module of the second embodiment.

Next, a semiconductor device 2 and a semiconductor device module 102 of a second embodiment are described with reference to FIG. 5.

The semiconductor device 2 and the semiconductor device module 102 of the present embodiment differ from the semiconductor device 1 and the semiconductor device module 101 of the first embodiment with respect to the following points. However, because the other points are the same, description of the structures and operations/effects of points that are the same is omitted.

In the semiconductor device 1 of the first embodiment, a QFP (Quad Flat Package) type package is used. The lead terminals 54 are provided at the four sides of the package. The lead terminals 54 are bent midway therealong, and the bottom surfaces 55s of the outer side portions 55 of the lead terminals 54 are substantially the same heights as the bottom surfaces 42s, 43s, 44s of the external connection sub-terminals 42, 43 and the external connection control terminal 44 of the GaN chip 10. In the semiconductor device module 101 of the first embodiment, the bottom surfaces 55s of the lead terminals 54, together with the bottom surfaces 42s, 43s, 44s of the external connection sub-terminals 42, 43 and the external connection control terminal 44 of the GaN chip 10, are connected onto the wires 82 of the motherboard 80 by the solder 67. In contrast, in the present embodiment, the semiconductor device 2 uses a DIP (Dual Inline Package) type package. The lead terminals 54 are provided at opposing two sides of the package. The lead terminals 54 are bent 90° midway therealong, and the outer side portions 55 of the lead terminals 54 are substantially orthogonal to the reverse surface 71 of the sealing resin 70. The motherboard 80 has the substrate 81, the wires 82 that are formed on the top surface 83, wires 85 that are formed on a bottom surface 87, through-holes 84 that are provided in the substrate 81 between the wires 82 and the wires 85, and metal layers 86 that are provided at the side surfaces of the through-holes 84. In the semiconductor device module 102 of the second embodiment, the outer side portions 55 of the lead terminals 54 are inserted into the through-holes 84, and are connected to the wires 82 of the top surface 83 and the wires 85 of the bottom surface 87 of the substrate 81 respectively by the solder 67, 69. In the present embodiment, because the semiconductor device 2 is mounted to the motherboard 80 via the through-holes 84, adjustment of the heights of the lead terminals 54 is easy.

The method of fabricating the semiconductor device 2 of the present embodiment is substantially the same as the method of fabricating the semiconductor device 1 of the first embodiment, up to the protective sheet peeling-off process (step S108) of FIG. 7. Thereafter, in a lead processing step (step S109), the lead terminals 54 are bent 90° midway therealong, and the outer side portions 55 of the lead terminals 54 are made to be substantially perpendicular to the reverse surface 71 of the sealing resin 70. Due to the above, the package is completed, and the semiconductor device 2 is fabricated (refer to step S110 of FIG. 7).

Third Embodiment

Figure 6:
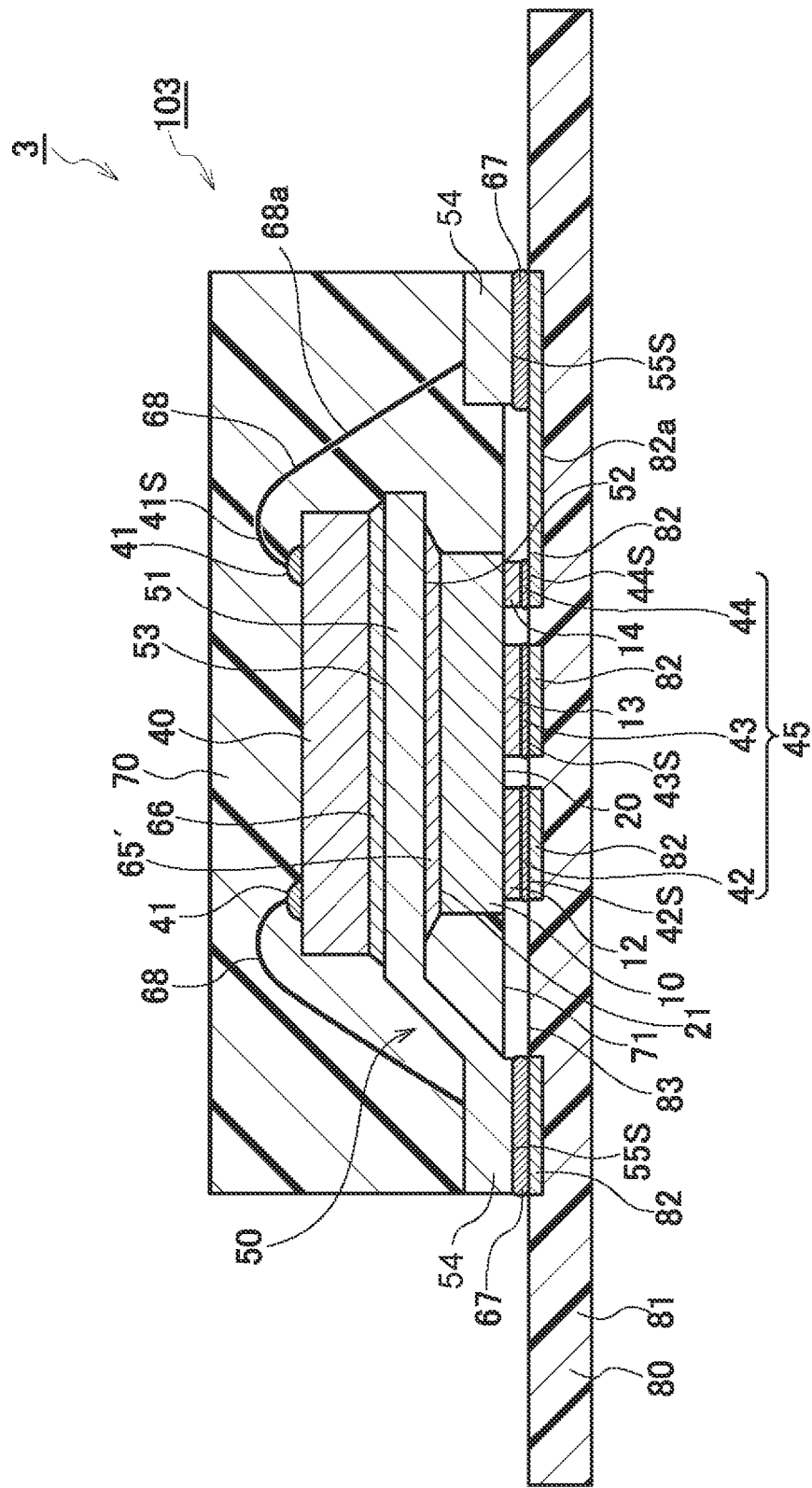
FIG. 6 is a schematic longitudinal sectional view for explaining the semiconductor device and the semiconductor device module of the third embodiment.

Next, a semiconductor device 3 and a semiconductor device module 103 of a third embodiment are described with reference to FIG. 6.

The semiconductor device 3 and the semiconductor device module 103 of the present embodiment differ from the semiconductor device 1 and the semiconductor device module 101 of the first embodiment with respect to the following points. However, because the other points are the same, description of the structures and operations/effects of points that are the same is omitted.

Figure 13:
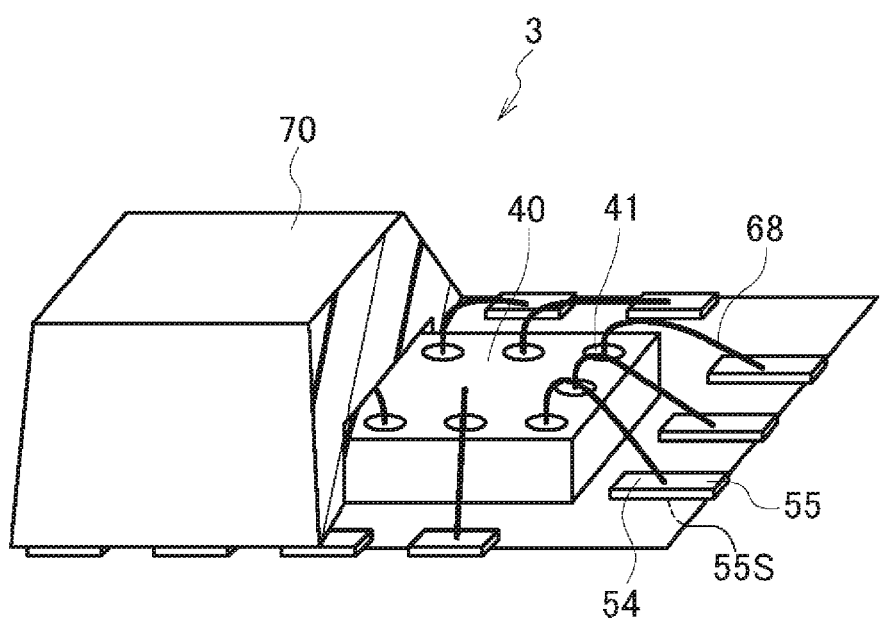
FIG. 13 is a partially cut-out schematic perspective view for explaining a QFN type package.

In the semiconductor device 1 of the first embodiment, a QFP (Quad Flat Package) type package is used. The lead terminals 54 are provided at the four sides of the package. The inner side portions 56 of the lead terminals 54 are sealed by the sealing resin 70, but, from midway along, the lead terminals 54 are exposed from the sealing resin 70, and the outer side portions 55, that are connected to the wires 82 of the motherboard 80, project-out from the sealing resin 70 and are completely exposed. In contrast, the semiconductor device 3 of the present embodiment uses a QFN (Quad Flat Non-lead Package) type package such as that illustrated in FIG. 13. The lead terminals 54 are provided at the four sides of the package. The terminals 41 of the chip 40 are connected to the lead terminals 54 by the bonding wires 68. Referring to FIG. 6 and FIG. 13, the lead terminals 54 are parallel to the top surface 83 of the wiring board 80 on which the QFN is mounted. The lead terminals 54 are sealed by the sealing resin 70, but bottom surfaces 55s of the lead terminals 54 are exposed from the reverse surface 71 of the sealing resin 70. The bottom surfaces 55s of the lead terminals 54 are substantially the same heights as the bottom surfaces 42s, 43s, 44s of the external connection sub-terminals 42, 43 and the external connection control terminals 44 of the GaN chip 10. In the semiconductor device module 103 of the present embodiment, the lead terminals 54 and the external connection terminal 45 (the external connection sub-terminals 42, 43 and the external connection control terminal 44) of the GaN chip 10 are connected to the wires 82 of the motherboard 80 via the solder 67. In the present embodiment, because the leads are located within the package, the leads can be made to be short. As a result, even higher-speed switching operation is possible, and further, the package can be made to be small. Note that, in the semiconductor device 1 of the first embodiment, the GaN chip 10 is mounted at the bottom surface 52 of the die stage 51 by the die bonding material 65. In the present embodiment, the GaN chip 10 is mounted, by an electrically-conductive paste or solder 65', at the bottom surface 52 of the die stage 51.

An example of a method of fabricating the semiconductor device 3 of the third embodiment is described next with reference to FIG. 7 and FIGS. 10A to 10D, 11A and 11B.

First, plural GaN type high-frequency high-output semiconductor elements, that serve as examples of power devices and that have an AlGaN layer that forms a heterojunction with GaN and that have a source electrode, a drain electrode and a gate electrode, are formed on a GaN wafer (refer to FIG. 7, step S101).

Next, solder bumps or solder balls, that are respectively connected to the source electrodes, the drain electrodes and the gate electrodes, are formed, and external connection terminals for surface mounting are formed (refer to FIG. 7, step S102). Note that wafer level packaging (WLCSP: Wafer Level Chip Size Packaging) may be carried out instead of forming the solder bumps or solder balls.

Next, dicing processing is carried out, and the GaN wafer is cut (refer to FIG. 7, step S103) into the plural GaN chips 10 (refer to FIGS. 2, 3).

Separately from these processes, plural semiconductor elements for control (logic) are formed at a silicon wafer (refer to FIG. 7, step S201).

Next, dicing processing is carried out, and the silicon wafer is cut (refer to FIG. 7, step S202) into the plural control chips 40 (refer to FIG. 1B).

Separately from these processes, a lead frame is fabricated (refer to FIG. 7, step S301). At this time, as illustrated in FIG. 10A, the lead frame 50 is bent reversely (bent reversely so as to be depressed), and the lead terminals 55 are made to be lower than the die stage 51.

Figure 10A:
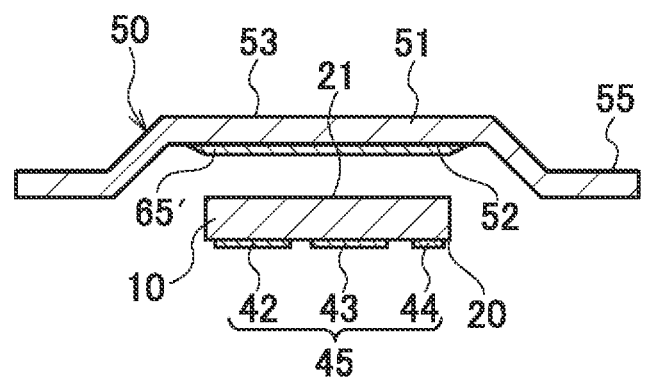
FIGS. 10A to 10D are schematic longitudinal sectional views for explaining the method of fabricating the semiconductor device of the third embodiment.

Next, the GaN chip 10 that serves as an example of a power device is mounted face-down on the bottom surface 52 of the die stage 51 of the lead frame 50 by an electrically-conductive paste or the solder 65' (refer to step S104 of FIG. 7, and FIG. 10A). The reverse surface 21 of the GaN chip 10 faces the bottom surface 52 of the die stage 51, and the obverse 20 and the external connection terminal 45 of the GaN chip 10 face toward the side opposite to the die stage 51.

Figure 10B:
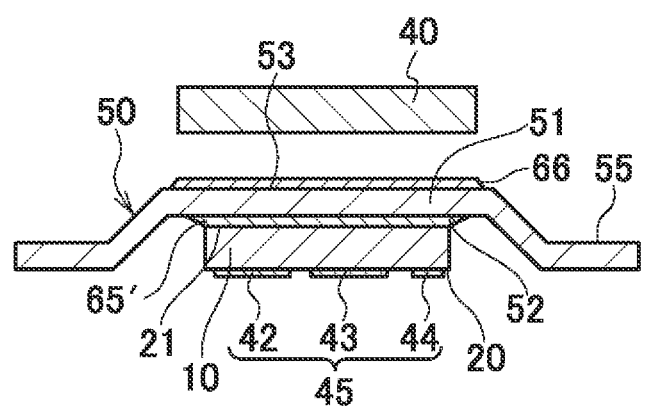

Next, the control chip 40 is mounted face-up on the top surface 53 of the die stage 51 by the die bonding material 66 (refer to step S105 of FIG. 7, and FIG. 10B).

Figure 10C:
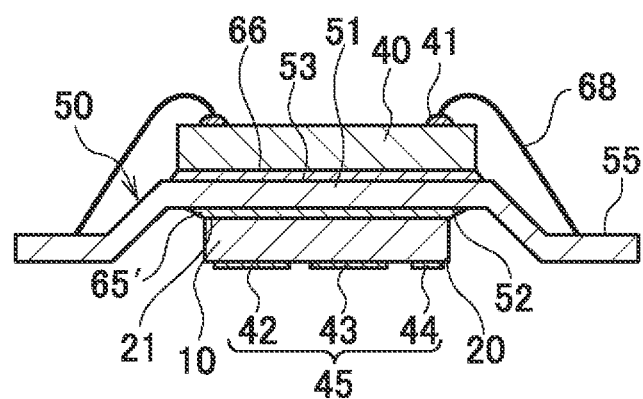

Next, the terminals 41 of the control chip 40 are connected by the bonding wires 68 to the lead terminals 55 (refer to step S106 of FIG. 7, and FIG. 10C). Note that the GaN chip 10 is not wire bonded.

Figure 10D:
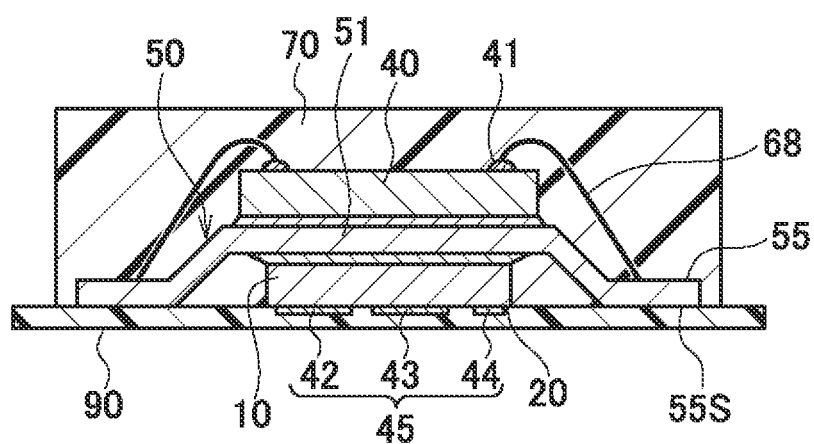

Next, the pressure-resistant protective sheet 90 is set in the lower mold of a sealing mold (not illustrated), and mold sealing is carried out together with the protective sheet 90 (refer to step S107 of FIG. 7, and FIG. 10D). At this time, the external connection terminal 45 and the obverse 20 of the GaN chip 10, and the bottom surfaces 55s of the lead terminals 55, are covered by the protective sheet 90. The GaN chip 10, the control chip 40, the die stage 51, the bonding wires 68, and the lead terminals 55 are sealed by the sealing resin 70. For example, PTFE is preferably used as the protective sheet 90. The protective sheet 90 is used in order to prevent the sealing resin 70 from finding its way around to the obverse 20 and the external connection terminal 45 of the GaN chip 10 and to the bottom surfaces 55s of the lead terminals 55, and to protect the obverse 20 and the external connection terminal 45 of the GaN chip 10 and the bottom surfaces 55s of the lead terminals 55.

Figure 11A:
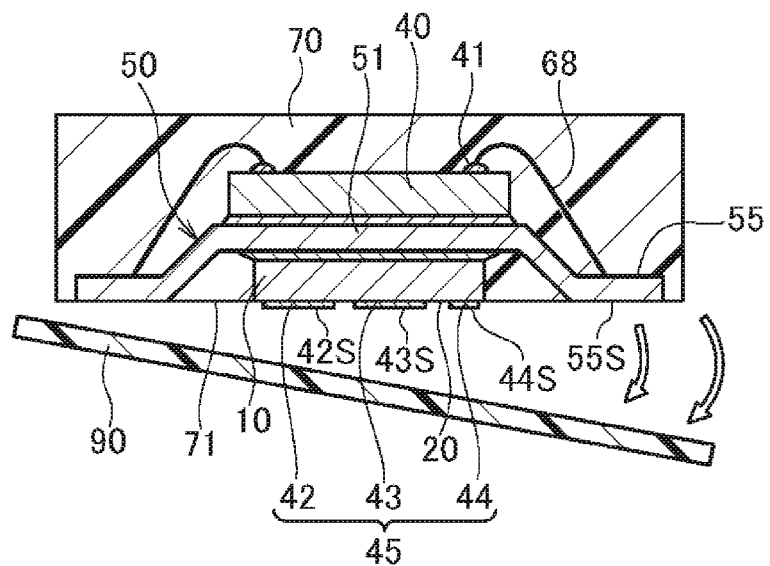
FIGS. 11A and 11B are schematic longitudinal sectional views for explaining the method of fabricating the semiconductor device of the third embodiment.
Figure 11B:
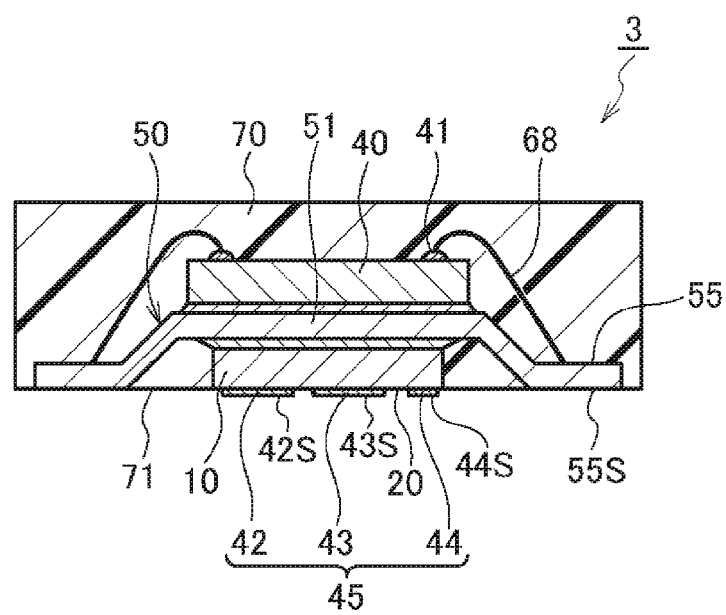

After completion of the mold sealing, the protective sheet 90 is peeled-off, and the obverse 20 of the GaN chip 10 is exposed at the package bottom surface (refer to step S108 of FIG. 7, and FIG. 11A). At this time, the external connection terminal 45 of the GaN chip 10 and the bottom surfaces 55s of the lead terminals 55 are exposed. By using the protective sheet 90 in this way, the bottom surfaces of the external connection terminal 45 of the GaN chip 10 and the bottom surfaces 55s of the lead terminals 55 can be exposed easily merely by adding the step of providing the protective sheet 90 and the step of peeling-off the protective sheet 90. The bottom surfaces 55s of the lead terminals 55 are substantially the same heights (refer to FIG. 11B) as the bottom surfaces of the external connection terminal 45 of the GaN chip 10 (the bottom surfaces 42s, 43s, 44s of the external connection sub-terminals 42, 43 and the external connection control terminal 44). Note that, in the present embodiment, a lead processing step (refer to step S109 in FIG. 7), that bends the lead terminals 54 midway therealong, or the like, is not needed.

Due to the above, the package is completed, and the semiconductor device 3 is fabricated (refer to step S110 of FIG. 7).

Fourth Embodiment

Figure 14:
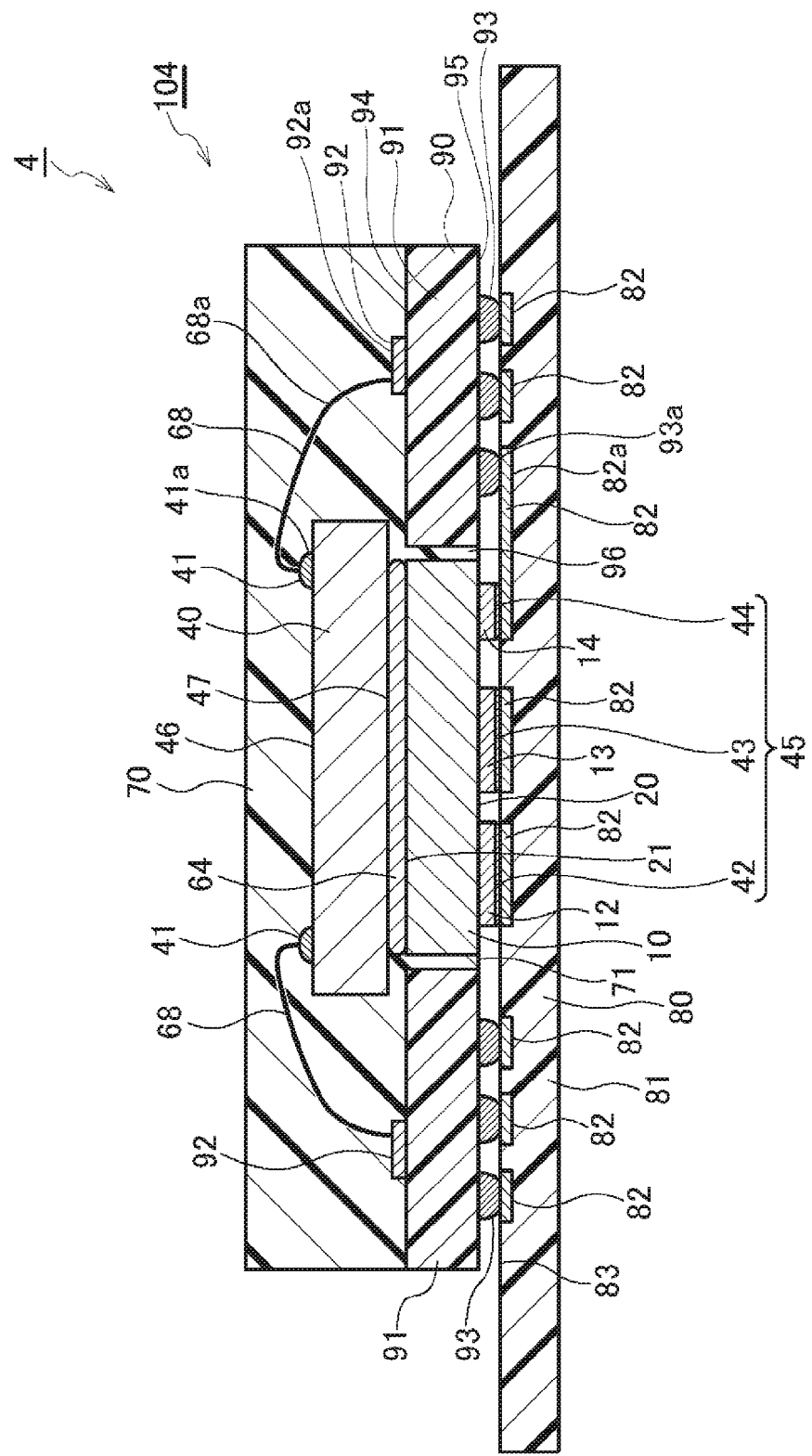
FIG. 14 is a schematic longitudinal sectional view for explaining the semiconductor device and the semiconductor device module of the fourth embodiment.
Figure 15:
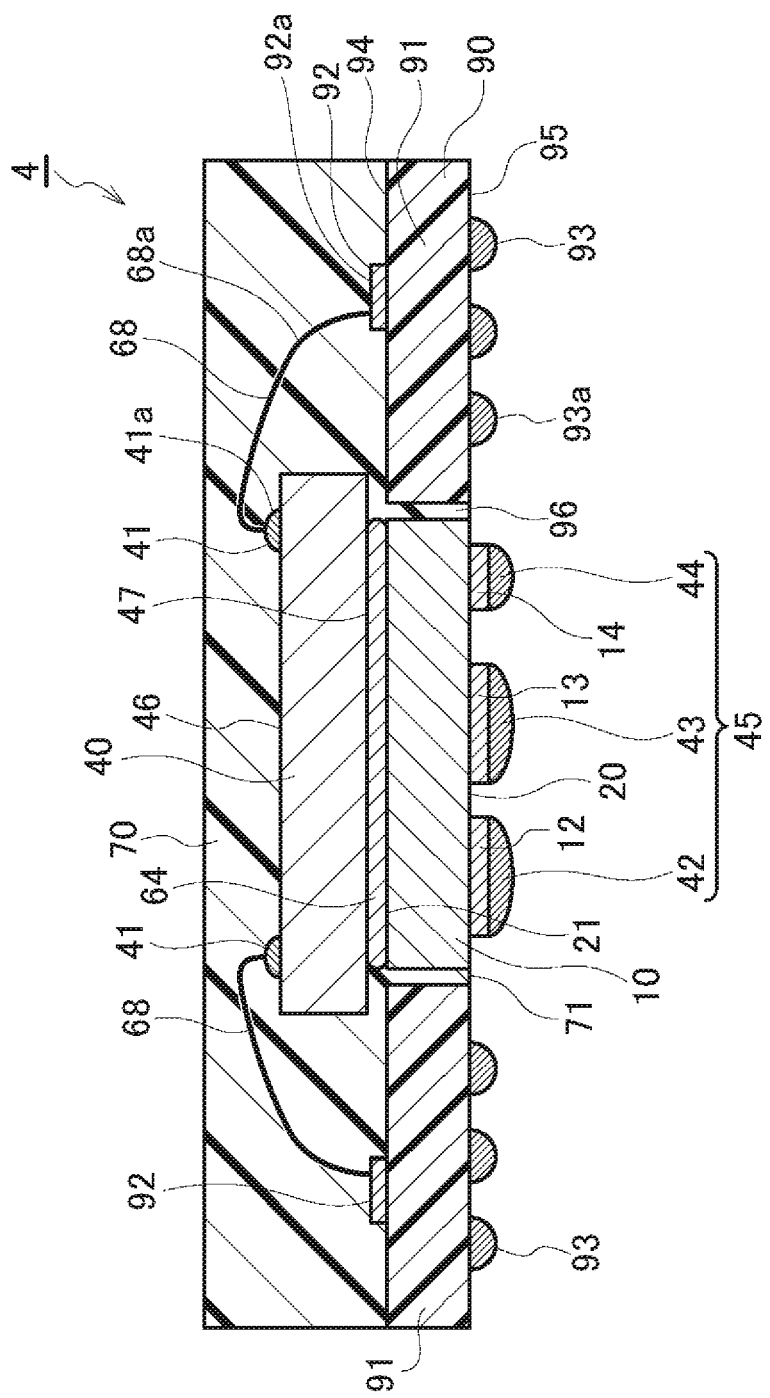
FIG. 15 is a schematic longitudinal sectional view for explaining the semiconductor device of the fourth embodiment.

A semiconductor device 4 and a semiconductor device module 104 of a fourth embodiment are described next with reference to FIGS. 14 and 15. The semiconductor device 4 has the GaN chip 10, the control chip 40, an interposer (thin wiring board) 90, and the sealing resin 70. The GaN chip 10 and the control chip 40 are made into a single package. The semiconductor device module 104 has the semiconductor device 4 and the motherboard 80. The interposer 90 is an example of a relay substrate. The motherboard 80 is an example of a wiring board.

The GaN chip 10 has, on the obverse 20 thereof, the external connection terminal 45. The external connection terminal 45 has the external connection sub-terminals 42, 43 and the external connection terminal 44. The external connection sub-terminal 42 is connected to the source electrode 12 (refer to FIGS. 1A, 1B, 2, 3). The external connection sub-terminal 43 is connected to the drain electrode 13 (refer to FIGS. 1A, 1B, 2, 3). The external connection control terminal 44 is connected to the gate electrode 14 (refer to FIGS. 1A, 1B, 2, 3). The external connection sub-terminals 42, 43 and the external connection control terminal 44 are preferably formed by, for example, the solder bumps 22, 23, 24 (refer to FIG. 2) or the solder balls 35, 36, 37 (refer to FIG. 3). The solder bumps 22, 23, 24 and the solder balls 35, 36, 37 may be formed by Cu/Ni or the like instead of solder.

At the interposer 90, solder balls 93 are disposed in the form of a grid on an obverse 95 of a resin substrate 91. Terminals 92 or wires (not illustrated) are disposed on a reverse surface 94 of the resin substrate 91. The solder balls 93 and the terminals 92 are connected by through-holes (not illustrated) that are provided within the resin substrate 91, or by wires (not illustrated) of the reverse surface 94 of the resin substrate 91, or by wires (in the case of a multilayer substrate) (not illustrated) that are provided within the resin substrate 91. An opening 96 is formed in the central portion of the interposer 90. The solder balls 93 are provided at the obverse 95 at the four sides of the resin substrate 91, except for the opening 96.

The semiconductor device 4 of the present embodiment is structured as a BGA (Ball Grid Array) type package. The GaN chip 10 and the control chip 40 are disposed at the central portion of the interposer 90. The GaN chip 10 is disposed within the opening 96 of the central portion of the interposer 90. The obverse 20 of the GaN chip 10 is disposed so as to face downward, and the GaN chip 10 is mounted face-down. The reverse surface 21 of the GaN chip 10 and a reverse surface 47 of the control chip 40 are adhered by an adhesive 64. The control chip 40 is mounted face-up on the reverse surface 21 of the GaN chip 10. The terminals 41 of an obverse 46 of the control chip 40 are connected by the bonding wires 68 to the terminals 92 of the reverse surface 94 of the interposer 90. For example, metal wires are suitably used as the bonding wires 68.

The GaN chip 10, the control chip 40 and the interposer 90 are sealed by the sealing resin 70. The bonding wires 68 also are sealed by the sealing resin 70. The obverse 20 and the external connection terminal 45 of the GaN chip 10, and the obverse 95 and the solder balls 93 of the interposer 90, are exposed from the sealing resin 70. The external connection terminal 45 of the GaN chip 10 and the solder balls 93 of the interposer 90 are substantially the same height.

The motherboard 80 has the substrate 81, and the wires 82 that are formed on the top surface 83 of the substrate 81. The solder balls 93 of the interposer 90 are connected to the wires 82. The control chip 40 is connected to the motherboard 80 via the interposer 90, and is mounted to the motherboard 80. The external connection terminal 45 (the external connection sub-terminals 42, 43 and the external connection control terminal 44) of the GaN chip 10 is connected to the wires 82. Via the external connection terminal 45, the GaN chip 10 is directly connected to the motherboard 80, and is mounted to the motherboard 80.

The gate electrode 14 (refer to FIGS. 1A, 1B, 2, 3) is connected to the terminal 41a for gate connection of the control chip 40, via the external connection control terminal 44, the wire 82a of the motherboard 80, a solder ball 93a, and the bonding wire 68a.

In the present embodiment, the GaN chip 10 and the control chip 40 are layered vertically and made into a single package, and therefore, the mounting surface area can be made to be small.

Further, because the GaN chip 10 and the control chip 40 are made into a single package, the assembly processes are simplified.

The external connection terminal 45 of the GaN chip 10 and the solder balls 93 of the interposer 90 are substantially the same height. Therefore, the solder balls 93 and the external connection terminal 45 of the GaN chip 10 are both connected to the motherboard 80.

The external connection terminal 45 (the external connection sub-terminals 42, 43 and the external connection control terminal 44) is exposed from the reverse surface 71 of the sealing resin 70. Further, the GaN chip 10 is directly connected to the motherboard 80 via the external connection terminal 45. Therefore, a large current can be made to flow. Further, without providing a heat dissipating plate, the heat of the GaN chip 10 can be dissipated effectively from the external connection terminal 45 directly to the motherboard 80. Moreover, by making the number of the external connection sub-terminals 42, 43 large and making the total surface area, i.e., the heat dissipating surface areas, thereof large, the heat of the GaN chip 10 can be effectively dissipated. As a result, the semiconductor device 4 of the present embodiment is suitably applied to high-output semiconductor elements such as the GaN chip 10 or the like. Further, because the inductance of the external connection terminal 45 can be made to be sufficiently low, high-speed operation is possible. Accordingly, the semiconductor device 4 of the present embodiment is preferably applied to high-frequency semiconductor elements such as the GaN chip 10 or the like.

In particular, the external connection sub-terminal 42, that is connected to the source electrode 12 (refer to FIGS. 1A, 1B, 2, 3), and the external connection sub-terminal 43, that is connected to the drain electrode 13 (refer to FIGS. 1A, 1B, 2, 3), are directly connected to the motherboard 80. Accordingly, the wiring inductance of the source and the drain can be greatly reduced, and current does not go through superfluous wires, leads or substrate wires. Therefore, high-speed switching is possible, and a large current can easily be made to flow.

The external connection control terminal 44, that is connected to the gate electrode 14 (refer to FIGS. 1A, 1B, 2, 3) also is connected directly to the motherboard 80. Further, the external connection control terminal 44 is connected to the terminal 41a for gate connection of the control chip 40 via the wire 82a of the motherboard 80, the solder ball 93a, the bonding wire 68a, and the like. In this way, the gate of the GaN chip 10 and the control chip 40 that controls this gate can be connected via the motherboard 80, and therefore, the structure is simple.

An example of a method of fabricating the semiconductor device 4 of the fourth embodiment is described next with reference to FIG. 16 and FIGS. 17A to 17D, and 18A to 18D.

Figure 16:
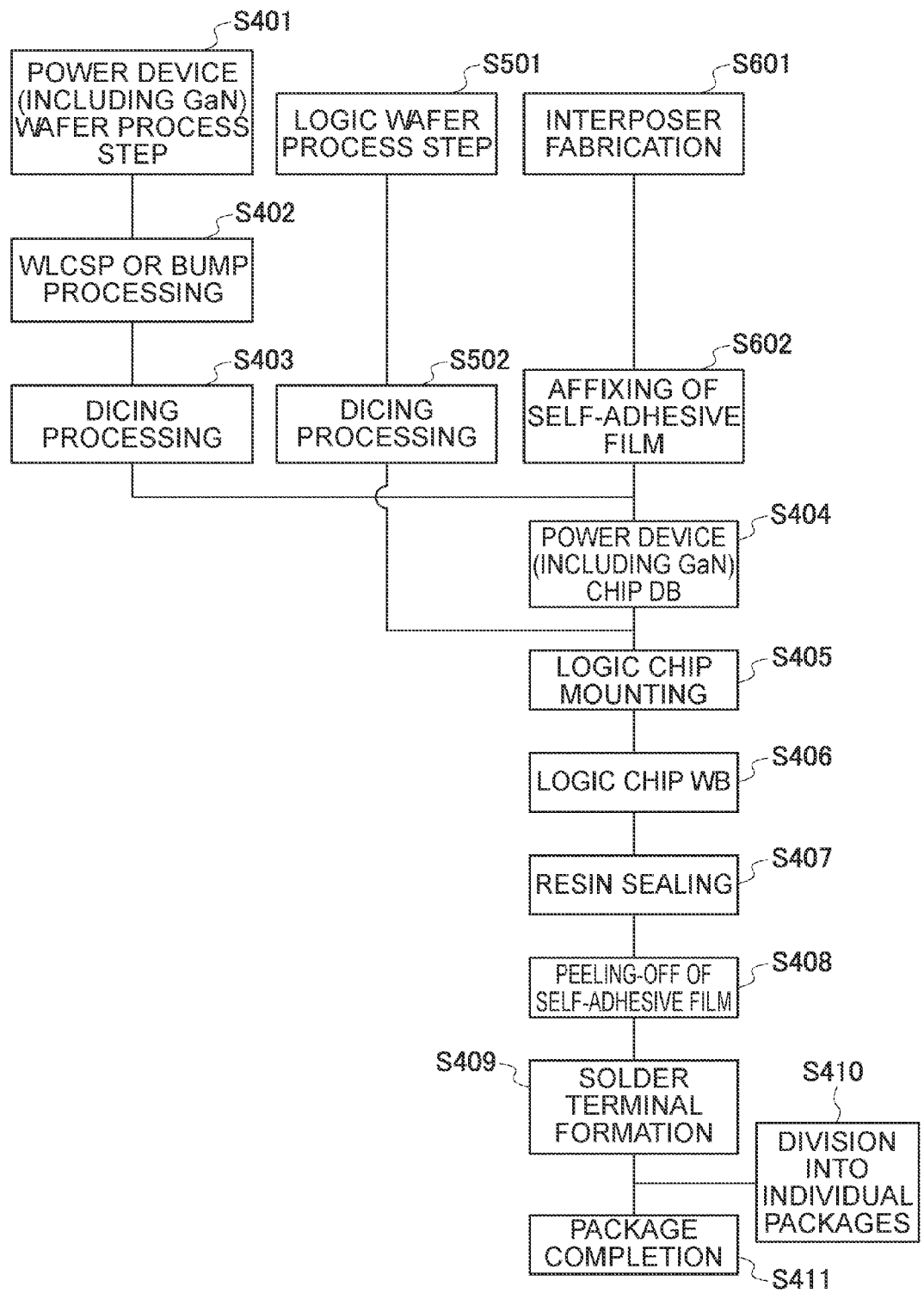
FIG. 16 is a flowchart for explaining a method of fabricating the semiconductor device of the fourth embodiment.

First, plural GaN type high-frequency high-output semiconductor elements, that serve as examples of power devices and that have an AlGaN layer that forms a heterojunction with GaN and that have a source electrode, a drain electrode and a gate electrode, are formed on a GaN wafer (refer to FIG. 16, step S401).

Next, the solder bumps 22, 23, 24 (refer to FIG. 2) or the solder balls 35, 36, 37 (refer to FIG. 3), that are respectively connected to the source electrodes, the drain electrodes and the gate electrodes, are formed, and external connection terminals for surface mounting are formed (refer to FIG. 16, step S402). Note that wafer level packaging (WLCSP: Wafer Level Chip Size Packaging) may be carried out instead of forming the solder bumps or solder balls.

Next, dicing processing is carried out, and the GaN wafer is cut (refer to FIG. 16, step S403) into the plural GaN chips 10 (refer to FIGS. 2, 3).

Separately from these processes, plural semiconductor elements for control (logic) are formed at a silicon wafer (refer to FIG. 16, step S501).

Next, dicing processing is carried out, and the silicon wafer is cut (refer to FIG. 16, step S502) into the plural control chips 40 (refer to FIG. 1B).

Figure 17A:
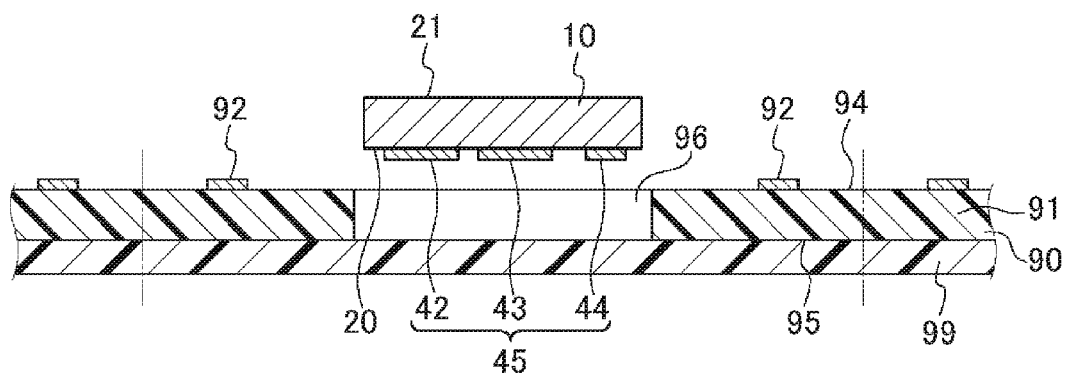
FIGS. 17A to 17D are schematic longitudinal sectional views for explaining the method of fabricating the semiconductor device of the fourth embodiment.

Separately from these processes, the interposer 90 is fabricated (refer to FIG. 16, step S601, and FIG. 17A). The interposer 90 is in the form of a sheet that can be divided into numerous interposers. The plural openings 96 are provided in the sheet-shaped interposer 90 (refer to FIG. 17A). Next, a self-adhesive film 99 is affixed to the obverse 95 of the interposer 90 (refer to FIG. 16, step S602, and FIG. 17A). The self-adhesive film 99 has a flexible adhesive layer (not illustrated) into which the external connection terminals 45 of the GaN chips 10 are embedded. Note that, at this time, the solder bumps 22, 23, 24 (refer to FIG. 2) or the solder balls 35, 36, 37 (refer to FIG. 3) that can be mounted do not yet have to be formed on the obverses 20 of the GaN chips 10.

Figure 17B:
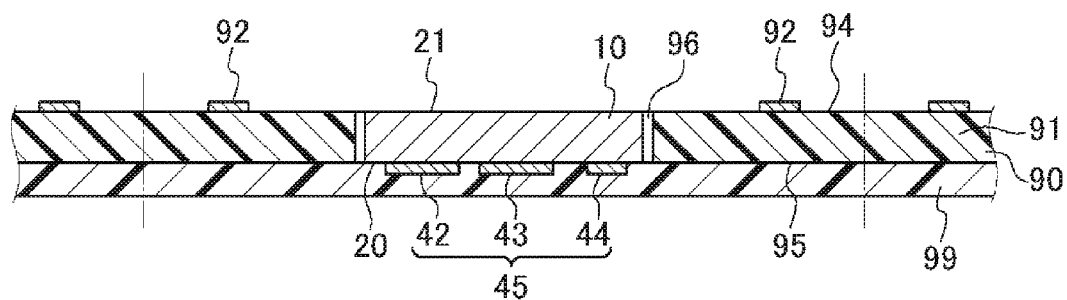

Next, the GaN chips 10, that are examples of power devices, are inserted into the openings 96 of the interposer 90, and the GaN chips 10 are mounted face-down at the interposer 90 (refer to step S404 of FIG. 16, and FIG. 17B). At this time, the obverses 20 of the GaN chips 10 at which the external connection terminals 45 are provided are the bottom sides, and the reverse surfaces 21 are the upper sides. The external connection terminals 45 of the GaN chips 10 are embedded into the flexible adhesive layer (not illustrated) of the self-adhesive film 99.

Figure 17C:
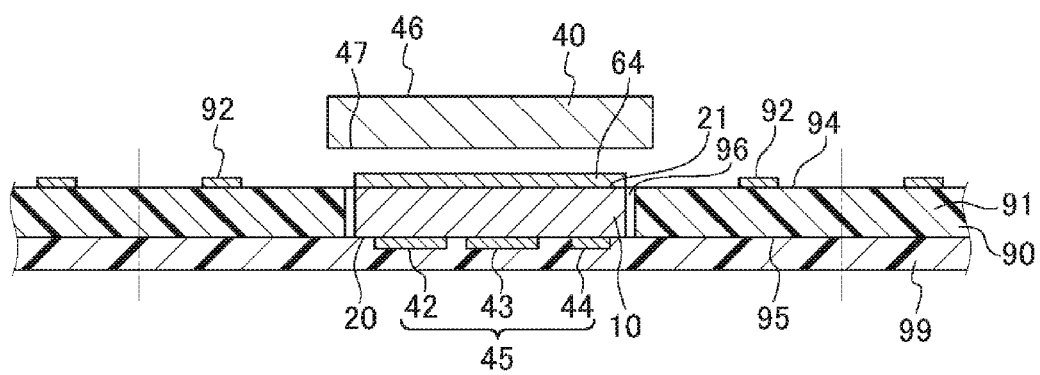

Next, the reverse surfaces 47 of the logic chips 40 are affixed via the adhesives 64 provided on the reverse surfaces 21 of the GaN chips 10, with the obverses (circuit surfaces) 46 of the control chips 40 being the upper sides thereof (refer to step S405 of FIG. 16, and FIG. 17C). The control chips 40 are mounted face-up on the GaN chips 10. Note that either a paste-like adhesive or a film-like adhesive can be used for the adhesives 64.

Figure 17D:
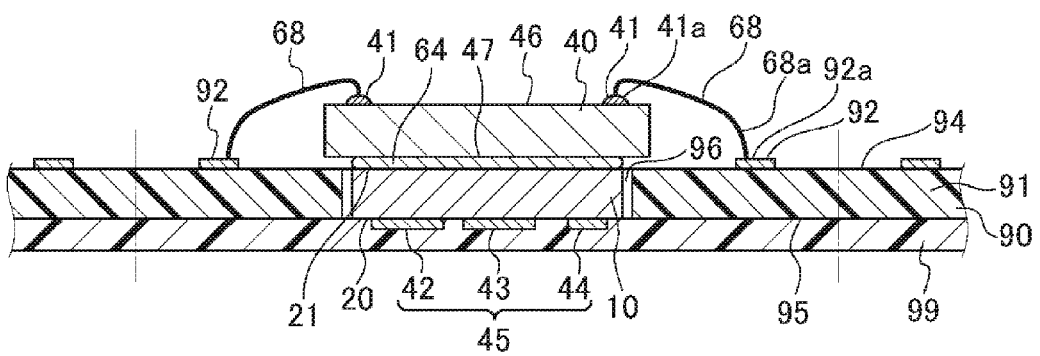

Next, the terminals 41 of the logic chips 40 are connected by the bonding wires 68 to the predetermined terminals 92 of the interposer 90 (refer to step S406 of FIG. 16, and FIG. 17D). Note that the GaN chips 10 are not wire bonded.

Figure 18A:
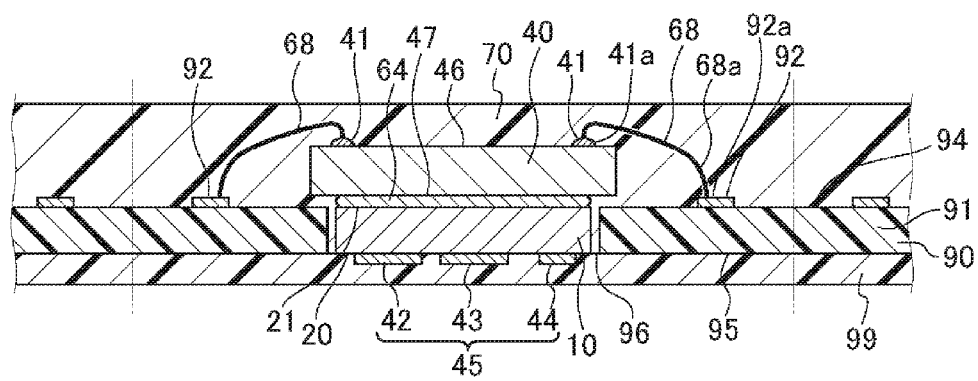
FIGS. 18A to 18D are schematic longitudinal sectional views for explaining the method of fabricating the semiconductor device of the fourth embodiment.

Next, the sealing resin 70 is formed, and mold sealing is carried out (refer to step S407 of FIG. 16, and FIG. 18A). At this time, the external connection terminals 45 and the obverses 20 of the GaN chips 10 and the obverse 95 of the interposer 90 remain covered by the self-adhesive film 99. The GaN chips 10, the control chips 40, the interposer 90, and the bonding wires 68 are sealed by the sealing resin 70. For example, a polyimide type film is preferably used as the self-adhesive film 99. A film that can withstand the heat at the time of the mold sealing is used as the self-adhesive film 99. Further, a film whose adhesive force can be weakened by heating is preferably used. The self-adhesive film 99 is used in order to prevent the sealing resin 70 from finding its way around to the obverses 20 and the external connection terminals 45 of the GaN chips 10 and the obverse 95 of the interposer 90, and to protect the obverses 20 and the external connection terminals 45 of the GaN chips 10 and the obverse 95 of the interposer 90.

Figure 18B:
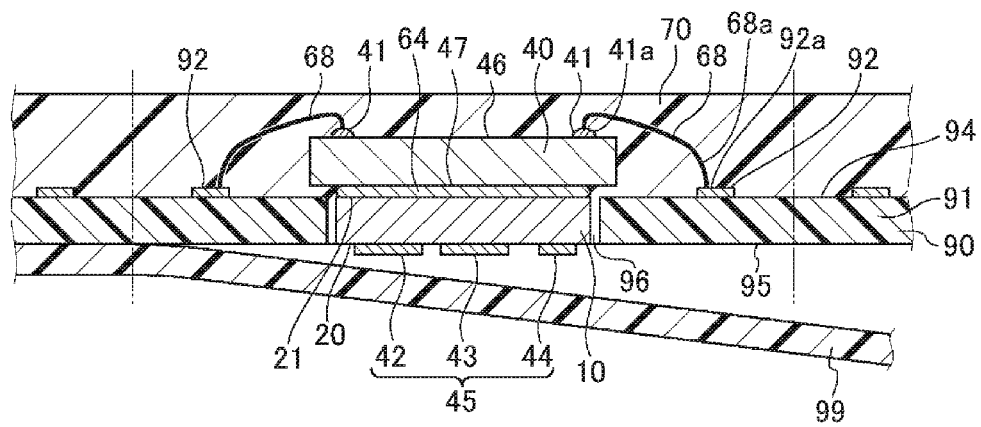

After completion of the mold sealing, the self-adhesive film 99 is peeled-off, and the obverses 20 of the GaN chips 10 and the obverse 95 of the interposer 90 are exposed (refer to step S408 of FIG. 16, and FIG. 18B). At this time, the external connection terminals 45 of the GaN chips 10 are exposed.

Figure 18C:
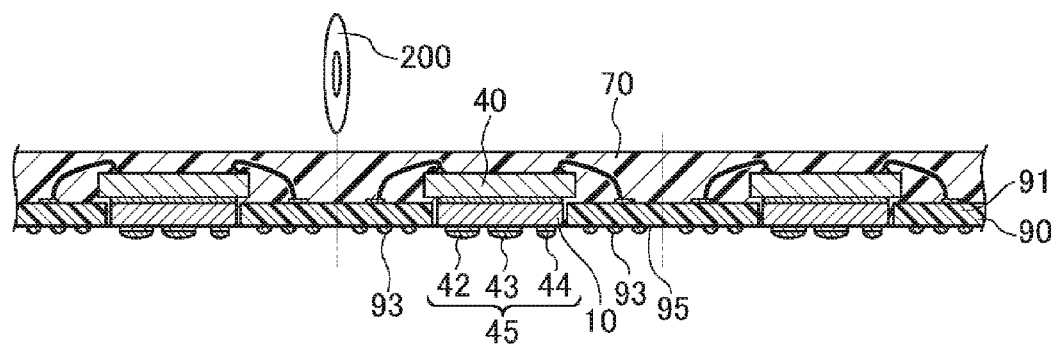

Next, the solder balls 93 are formed on the obverse 95 of the interposer 90 (refer to step S409 of FIG. 16, and FIG. 18C). Note that, in a case in which the solder bumps 22, 23, 24 (refer to FIG. 2) or the solder balls 35, 36, 37 (refer to FIG. 3) that serve as the external connection terminal 45 have not been formed on the obverses 20 of the GaN chips 10, the solder bumps 22, 23, 24 (refer to FIG. 2) or the solder balls 35, 36, 37 (refer to FIG. 3) are formed. The solder bumps 22, 23, 24, the solder balls 93, the solder balls 35, 36, 37 are formed by solder plating, solder printing, or ball mounting.

Figure 18D:
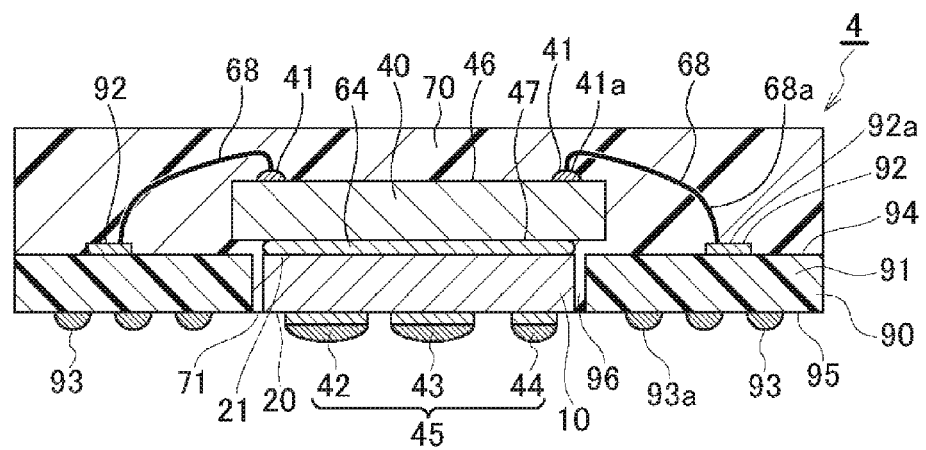

Thereafter, the structure is divided into individual packages by a dicing blade 200 or the like (refer to step S410 of FIG. 16, and FIG. 18C), the package is completed, and the semiconductor device 4 is fabricated (refer to step S411 of FIG. 16, and FIG. 18D). Note that the division into individual packages may be carried out by punching by using a mold or the like.

In the above-described respective embodiments, the GaN chip 10 is used as an example of a high-frequency high-output semiconductor element. However, high-frequency high-output semiconductor elements using materials other than GaN type materials also can be preferably used instead of the GaN chip 10. Further, not only a field effect transistor, but also a bipolar transistor can be preferably used instead of the GaN chip 10. Moreover, high-output semiconductor elements that do not operate at high frequencies such as, for example, SiC type high-output semiconductor elements, also can be preferably used instead of the GaN chip 10. Still further, high-frequency semiconductor elements and GaAs type high-frequency semiconductor elements, that are not high-output, also can be preferably used instead of the GaN chip 10.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions and alterations could be made hereto without departing from the spirit and scope of the invention.

What is claimed is:

1. A semiconductor device comprising:
a first semiconductor element at which a first external connection terminal is provided at a first surface;
a second semiconductor element mounted at a second surface side, that is at a side opposite to the first surface, of the first semiconductor element so as to be layered on the first semiconductor element;
a second external connection terminal that is connected to the second semiconductor element, and that has an electrical connection portion in the same plane as the plane in which the first external connection terminal extends; and
a sealing member that seals the first semiconductor element and the second semiconductor element in such a way as to expose the first external connection terminal and the electrical connection portion of the second external connection terminal, wherein
the first semiconductor element has a first electrode, a second electrode, and a control electrode that controls current flowing between the first electrode and the second electrode, at the first surface of the first semiconductor element, and the first external connection terminal includes a first external connection sub-terminal, a second external connection sub-terminal, and an external connection control terminal that are connected to the first electrode, the second electrode, and the control electrode, at the first surface of the first semiconductor element, respectively.

2. The semiconductor device of claim 1, wherein the first electrode and the second electrode are larger than the control electrode.

3. The semiconductor device of claim 1, wherein the second external connection terminal is a lead terminal of a lead frame, and the first semiconductor element and the second semiconductor element are mounted, respectively, at a first surface and a second surface that is at a side opposite to the first surface, of a die stage of the lead frame.

4. The semiconductor device of claim 3, wherein the die stage is directly connected to at least one of the lead terminals of the lead frame.

5. The semiconductor device of claim 1, further comprising a relay substrate, wherein
the second semiconductor element is connected to the second external connection terminal via the relay substrate, and
the first semiconductor element is disposed within an opening of the relay substrate.

6. The semiconductor device of claim 5, wherein the second external connection terminal is disposed at a first surface of the relay substrate, the first surface being exposed from the sealing member.

7. The semiconductor device of claim 1, wherein the first semiconductor element is a gallium nitride type semiconductor element.

8. The semiconductor device of claim 1, wherein the first semiconductor element is a gallium nitride type semiconductor element having a heterojunction between AlGaN and GaN.

9. The semiconductor device of claim 1, wherein the second semiconductor element is a semiconductor element for control that controls operation of the first semiconductor element.

10. The semiconductor device of claim 1, wherein the first external connection terminal is a projecting electrode that is exposed from the sealing member.

11. The semiconductor device of claim 10, wherein the projecting electrode is a bump or a ball.

12. The semiconductor device of claim 1, wherein the second semiconductor element and the second external connection terminal are connected by a wire.

13. The semiconductor device of claim 1, wherein the semiconductor device is a Quad Flat Package.

14. The semiconductor device of claim 1, wherein the semiconductor device is a Dual Inline Package.

15. The semiconductor device of claim 1, wherein the semiconductor device is a Quad Flat No-Lead Package.

16. The semiconductor device of claim 1, wherein the semiconductor device is a BGA.

17. A semiconductor device module comprising:
a wiring board, and
a semiconductor device, the semiconductor device including:
a first semiconductor element at which a first external connection terminal is provided at a first surface;
a second semiconductor element mounted at a second surface side, that is at a side opposite to the first surface, of the first semiconductor element so as to be layered on the first semiconductor element;
a second external connection terminal that is connected to the second semiconductor element, and that has an electrical connection portion in the same plane as the plane in which the first external connection terminal extends; and
a sealing member that seals the first semiconductor element and the second semiconductor element in such a way as to expose the first external connection terminal and the electrical connection portion of the second external connection terminal, wherein
the first semiconductor element has a first electrode, a second electrode, and a control electrode that controls current flowing between the first electrode and the second electrode, at the first surface of the first semiconductor element, and the first external connection terminal includes a first external connection sub-terminal, a second external connection sub-terminal, and an external connection control terminal that are connected to the first electrode, the second electrode, and the control electrode, at the first surface of the first semiconductor element, respectively.

18. The semiconductor device module of claim 17, wherein the second semiconductor element is a semiconductor element for control that controls operation of the first semiconductor element, and a control terminal of the first semiconductor element is connected to the second semiconductor element via the second external connection terminal and a wire of the wiring board.

19. A method of fabricating a semiconductor device, comprising:
preparing an assembly having a first semiconductor element that has a first surface and a second surface at a side opposite to the first surface and that has a first external connection terminal at the first surface, a second semiconductor element that is mounted at the second surface side of the first semiconductor element so as to be layered on the first semiconductor element, and a second external connection terminal that is connected to the second semiconductor element and that has an electrical connection portion in the same plane as the plane in which the first external connection terminal extends, the first semiconductor element having a first electrode, a second electrode, and a control electrode that controls current flowing between the first electrode and the second electrode, at the first surface of the first semiconductor element, and the first external connection terminal including a first external connection sub-terminal, a second external connection sub-terminal, and an external connection control terminal that are connected to the first electrode, the second electrode, and the control electrode, at the first surface of the first semiconductor element, respectively;

in a state in which the first external connection terminal is covered by a protective sheet, sealing, by a sealing material, at least the first semiconductor element and the second semiconductor element; and peeling-off the protective sheet, and exposing the first external connection terminal.

* * * * *